US010324349B2

United States Patent
Fang et al.

(10) Patent No.: US 10,324,349 B2
(45) Date of Patent: Jun. 18, 2019

(54) REFLECTANCE-ADJUSTABLE REFLECTOR AND REFLECTANCE-ADJUSTABLE DISPLAY DEVICE

(71) Applicant: Coretronic Corporation, Hsin-Chu (TW)

(72) Inventors: Chong-Yang Fang, Hsin-Chu (TW); Wen-Chun Wang, Hsin-Chu (TW); Cheng-Chieh Liu, Hsin-Chu (TW)

(73) Assignee: Coretronic Corporation, Hsin-Chu (TW)

(*) Notice: Subject to any disclaimer, the term of this patent is extended or adjusted under 35 U.S.C. 154(b) by 47 days.

(21) Appl. No.: 15/181,425

(22) Filed: Jun. 14, 2016

(65) Prior Publication Data

US 2017/0357111 A1 Dec. 14, 2017

(51) Int. Cl.

| G02F 1/133 | (2006.01) |
|---|---|
| G02F 1/137 | (2006.01) |
| G02F 1/167 | (2019.01) |
| G02F 1/1335 | (2006.01) |
| G02F 1/1343 | (2006.01) |
| G02F 1/13363 | (2006.01) |
| H01L 51/52 | (2006.01) |

(52) U.S. Cl.
CPC .......... *G02F 1/137* (2013.01); *G02F 1/13363* (2013.01); *G02F 1/133536* (2013.01); *G02F 1/133553* (2013.01); *G02F 1/134309* (2013.01); *G02F 1/167* (2013.01); *H01L 51/5271* (2013.01); *H01L 51/5293* (2013.01); *G02F 2201/44* (2013.01); *G02F 2413/02* (2013.01); *G02F 2413/05* (2013.01)

(58) Field of Classification Search
CPC ...................... G02F 1/133536; G02F 1/13363
USPC ........................................................ 349/113
See application file for complete search history.

(56) References Cited

U.S. PATENT DOCUMENTS

| 5,128,799 A | 7/1992 | Byker | |
|---|---|---|---|
| 5,686,979 A | 11/1997 | Weber et al. | |
| 2006/0055838 A1* | 3/2006 | Mi | G02F 1/133528 349/30 |
| 2006/0274218 A1* | 12/2006 | Xue | G02F 1/133536 349/16 |

(Continued)

FOREIGN PATENT DOCUMENTS

| CN | 104608696 | 5/2015 |
|---|---|---|
| TW | I334041 | 12/2010 |

*Primary Examiner* — Christopher M Raabe
(74) *Attorney, Agent, or Firm* — JCIPRNET

(57) ABSTRACT

A reflectance-adjustable reflector including a phase modulation element and a first polarizer is provided. The phase modulation element includes a first substrate, a second substrate opposite to the first substrate, a phase modulation layer located between the first substrate and the second substrate, a first electrode layer located between the first substrate and the phase modulation layer, and a second electrode layer located between the second substrate and the phase modulation layer. Thicknesses of the first substrate and the second substrate are between 0.01 mm and 0.5 mm. The first polarizer is disposed on the first substrate. The first substrate is located between the first polarizer and the first electrode layer. A total thickness of the phase modulation element and the first polarizer is less than 1 mm. A reflectance-adjustable display device is also provided.

14 Claims, 14 Drawing Sheets

(56) References Cited

U.S. PATENT DOCUMENTS

| | | | |
|---|---|---|---|
| 2008/0106675 A1* | 5/2008 | Uesaka | G02B 5/3016 349/98 |
| 2010/0283943 A1* | 11/2010 | Kimura | B32B 38/1841 349/96 |
| 2016/0216540 A1* | 7/2016 | Cho | G02F 1/133536 |
| 2017/0045763 A1* | 2/2017 | Murao | G02F 1/13 |

* cited by examiner

REFLECTANCE-ADJUSTABLE REFLECTOR AND REFLECTANCE-ADJUSTABLE DISPLAY DEVICE

BACKGROUND OF THE INVENTION

Field of the Invention

The invention relates to a reflector and a display device and more particularly relates to a reflectance-adjustable reflector and a reflectance-adjustable display device.

Description of Related Art

In the conventional art, reflectance of a reflector or a display device is a fixed value. Namely, the reflectance of the reflector or the display device does not change with the intensity of light incident on the reflector or the display device. Since the reflectance of the reflector is generally quite high, the user often suffers the impact of glare when the reflector or the display device using the same is subject to strong light. For example, when driving at night, the rearview mirror is often subject to strong light emitted from the vehicle in the back, such that the driver suffers from the impact of glare, which often poses a threat to road safety. Therefore, how to produce a reflector or a display device that has adjustable reflectance to adapt to the environment is a target to be achieved by researchers of ordinary skill in the art.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY OF THE INVENTION

The invention provides a reflectance-adjustable reflector and a reflectance-adjustable display device that have adjustable reflectance.

Other objects and advantages of the invention can be further illustrated by the technical features broadly embodied and described as follows.

In order to achieve one or a portion of or all of the objects or other objects, an embodiment of the invention provides a reflectance-adjustable reflector that includes a phase modulation element and a first polarizer. The phase modulation element includes a first substrate, a second substrate, a phase modulation layer, a first electrode layer, and a second electrode layer. The second substrate is opposite to the first substrate, wherein thicknesses of the first substrate and the second substrate are between 0.01 mm and 0.5 mm. The phase modulation layer is located between the first substrate and the second substrate. The first electrode layer is located between the first substrate and the phase modulation layer. The second electrode layer is located between the second substrate and the phase modulation layer. The first polarizer is disposed on the first substrate, wherein the first substrate is located between the first polarizer and the first electrode layer, and a total thickness of the phase modulation element and the first polarizer is less than 1 mm.

In order to achieve one or a portion of or all of the objects or other objects, an embodiment of the invention provides a reflectance-adjustable display device that includes a display device and a reflectance-adjustable reflector. The display device has a display surface. The reflectance-adjustable reflector is located on the display surface and includes a phase modulation element and a first polarizer. The phase modulation element includes a first substrate, a second substrate, a phase modulation layer, a first electrode layer, and a second electrode layer. The second substrate is located between the display device and the first substrate, wherein thicknesses of the first substrate and the second substrate are between 0.01 mm and 0.5 mm. The phase modulation layer is located between the first substrate and the second substrate. The first electrode layer is located between the first substrate and the phase modulation layer. The second electrode layer is located between the second substrate and the phase modulation layer. The first polarizer is disposed on the first substrate, wherein the first substrate is located between the first polarizer and the first electrode layer, and a total thickness of the phase modulation element and the first polarizer is less than 1 mm.

Based on the above, the embodiments of the invention have at least one of the following advantages or effects. In the reflectance-adjustable reflector according to the embodiments of the invention, the phase retardation provided by the phase modulation layer may be controlled by modulating the electric potential difference between the first electrode layer and the second electrode layer. Thus, with the collaboration of the first polarizer, the amount of light reflected by the reflectance-adjustable reflector may be adjusted. Accordingly, the reflectance-adjustable reflector of the invention and the reflectance-adjustable display device using the same may render ideal reflectance to adapt to the environment. Moreover, since the thicknesses of the first substrate and the second substrate are between 0.01 mm and 0.5 mm, and the total thickness of the phase modulation element and the first polarizer is less than 1 mm, ghost image phenomenon can be avoided, and thereby improving the quality of a displayed image of the reflectance-adjustable reflector and the reflectance-adjustable display device.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing." "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
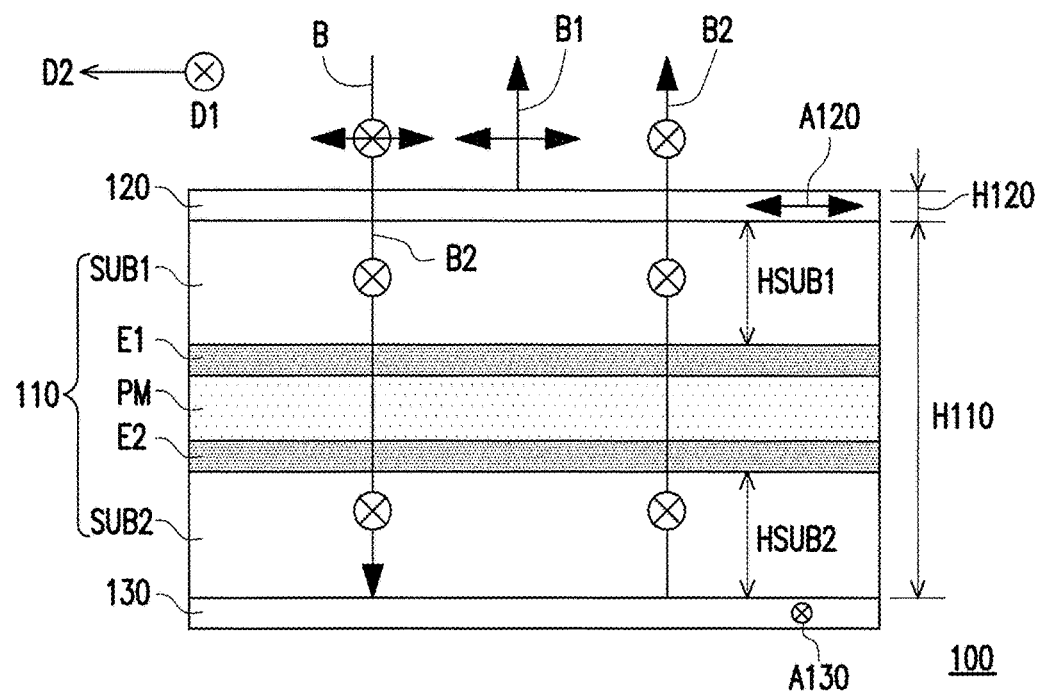
FIG. 1A and FIG. 1B are schematic diagrams illustrating a reflectance-adjustable reflector according to a first embodiment of the invention in a high reflectance mode and a low reflectance mode respectively.
Figure 1B:
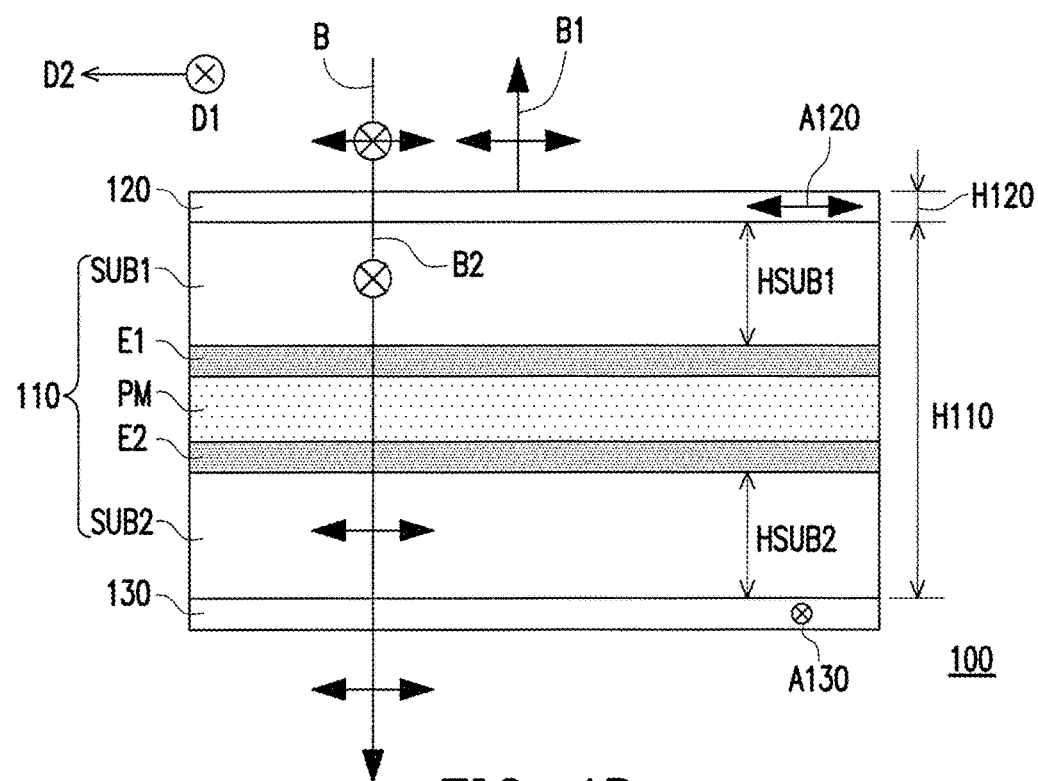
Figure 2A:
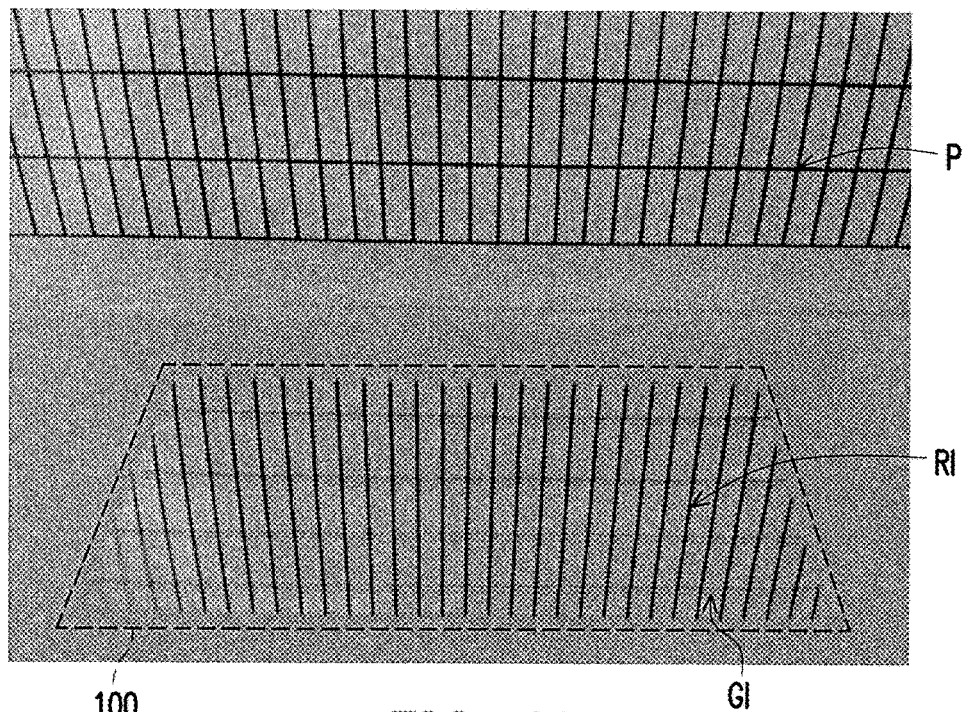
FIG. 2A presents a displayed image of the reflectance-adjustable reflector in FIG. 1A under the condition that thicknesses of the first substrate and the second substrate are greater than 0.5 mm.
Figure 2B:
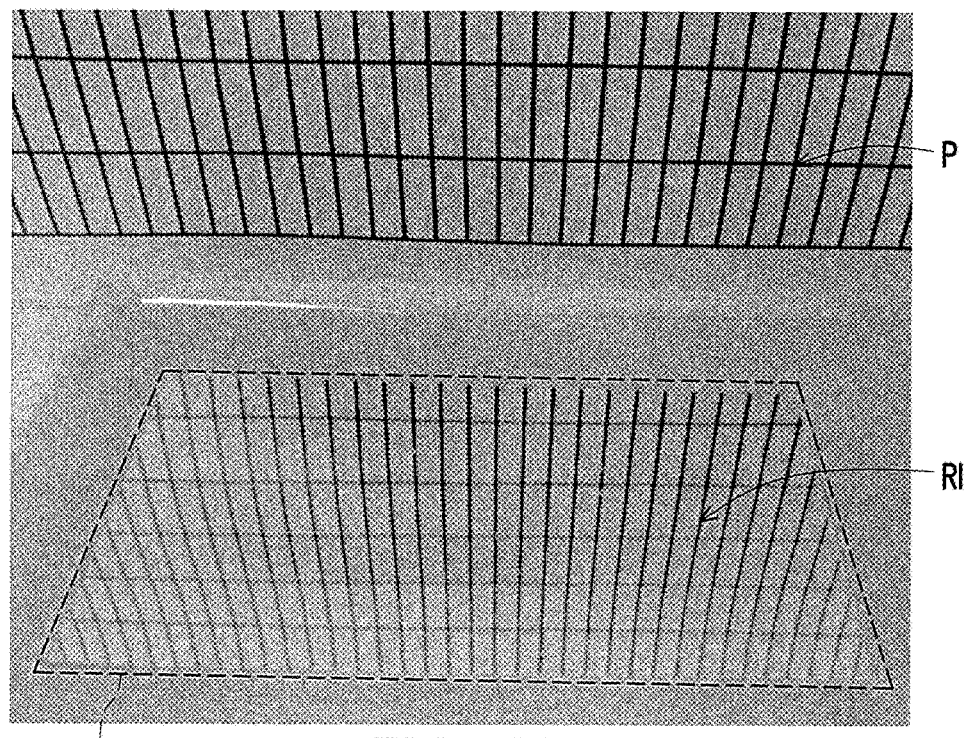
FIG. 2B presents a displayed image of the reflectance-adjustable reflector in FIG. 1A under the condition that thicknesses of the first substrate and the second substrate are less than 0.5 mm.

FIG. 1A and FIG. 1B are schematic diagrams illustrating a reflectance-adjustable reflector according to a first embodiment of the invention in a high reflectance mode and a low reflectance mode respectively. FIG. 2A presents a displayed image of the reflectance-adjustable reflector in FIG. 1A under the condition that thicknesses of the first substrate and the second substrate are greater than 0.5 mm. FIG. 2B presents a displayed image of the reflectance-adjustable reflector in FIG. 1A under the condition that thicknesses of the first substrate and the second substrate are less than 0.5 mm.

Referring to FIG. 1A and FIG. 1B, a reflectance-adjustable reflector 100 includes a phase modulation element 110 and a first polarizer 120. The phase modulation element 110 includes a first substrate SUB1, a second substrate SUB2, a phase modulation layer PM, a first electrode layer E1, and a second electrode layer E2. The second substrate SUB2 is opposite to the first substrate SUB1, wherein thicknesses (HSUB1 and HSUB2) of the first substrate SUB1 and the second substrate SUB2 are between 0.01 mm and 0.5 mm. The phase modulation layer PM is located between the first substrate SUB1 and the second substrate SUB2. The first electrode layer E1 is located between the first substrate SUB1 and the phase modulation layer PM. The second electrode layer E2 is located between the second substrate SUB2 and the phase modulation layer PM. The first polarizer 120 is disposed on the first substrate SUB1, wherein the first substrate SUB1 is located between the first polarizer 120 and the first electrode layer E1, and a total thickness of the phase modulation element 110 and the first polarizer 120, i.e. the sum of the thickness H110 of the phase modulation element 110 and the thickness H120 of the first polarizer 120, is less than 1 mm.

In the embodiment, the reflectance-adjustable reflector 100 further includes a second polarizer 130 disposed under the second substrate SUB2, wherein the second substrate SUB2 is located between the second polarizer 130 and the second electrode layer E2.

In detail, the first electrode layer E1 may be disposed on the first substrate SUB1, and the second electrode layer E2 may be disposed on the second substrate SUB2. The first substrate SUB1 and the second substrate SUB2 are then sealed under the condition that the first electrode layer E1 and the second electrode layer E2 are located between the first substrate SUB1 and the second substrate SUB2. After the first substrate SUB1 and the second substrate SUB2 are sealed, a space is kept between the first electrode layer E1 and the second electrode layer E2 to fill in the phase modulation layer PM. In the embodiment, the reflectance-adjustable reflector 100 may further includes a first alignment layer and a second alignment layer (not shown), wherein the first alignment layer is located between the first electrode layer E1 and the phase modulation layer PM, and the second alignment layer is located between the second electrode layer E2 and the phase modulation layer PM. The first polarizer 120 may be adhered to an outer surface of the first substrate SUB1, and the second polarizer 130 may be adhered to an outer surface of the second substrate SUB2.

However, the manufacturing methods and steps of the reflectance-adjustable reflector 100 are not limited to the above.

In the embodiment, the first polarizer 120 and the second polarizer 130 are reflection-type polarizing films, wherein reflection axes (A120 and A130) of the first polarizer 120 and the second polarizer 130 are vertical to each other. In detail, the reflection axis A130 of the second polarizer 130 is parallel to a first direction D1, and the reflection axis A120 of the first polarizer 120 is parallel to a second direction D2 that is vertical to the first direction D1. However, the invention is not limited to the above. Alternatively, extension directions of the reflection axis A120 and the reflection axis A130 may be switched. In another embodiment, the reflection axis A120 may be parallel to the reflection axis A130. In yet another embodiment, the first polarizer 120 may be an absorption-type polarizing film and an absorption axis thereof is parallel or vertical to the reflection axis A130.

The first substrate SUB1 and the second substrate SUB2 may be transparent substrates to avoid blocking the transmission of light. For example, the first substrate SUB1 and the second substrate SUB2 are respectively a thin glass substrate or a polymer transparent substrate. Compared to the thin glass substrate, the polymer transparent substrate has a higher mechanical strength under the same thickness. Therefore, the first substrate SUB1 and the second substrate SUB2 preferably use the polymer transparent substrates, but the invention is not limited thereto.

The polymer transparent substrates may possess a low birefringence. For example, a material of the polymer transparent substrates may include polymethylmethacrylate (PMMA), cyclo olefin copolymer (COC), cyclo olefin polymer (COP), polycarbonate (PC), or triacetyl cellulose (TAC). Alternatively, the polymer transparent substrates may possess birefringence. Besides, the optical axes (slow axes) of the polymer transparent substrates may be parallel or vertical to the reflection axes of the reflection-type polarizing films so as to avoid the generation of Mura phenomenon and to reduce reflectance or transmittance. For example, a material of the polymer transparent substrates may include polyethylene terephthalate (PET) or polycarbonate (PC), but the invention is not limited thereto.

The phase modulation layer PM is adapted to provide a phase difference based on an electric potential difference between the first electrode layer E1 and the second electrode layer E2. For example, the phase modulation layer PM is a liquid crystal layer, the first alignment layer and the second alignment layer (not shown) are respectively located at opposite sides of the phase modulation layer PM to align the direction of liquid crystal molecules of the liquid crystal layer, and the first electrode layer E1 and the second electrode layer E2 are transparent electrode layers, but the invention is not limited to the above.

A polarization state of the light entering the phase modulation element 110 may be changed depending on the phase difference provided by the phase modulation layer PM. Thereby, with the collaboration of the first polarizer 120 and the second polarizer 130, reflectance of the reflectance-adjustable reflector 100 may be controlled by modulating the electric potential difference between the first electrode E1 and the second electrode E2. For example, the reflectance of the reflectance-adjustable reflector 100 may be switched between a high reflectance mode and a low reflectance mode.

In detail, in the high reflectance mode, as shown in FIG. 1A, light B incident on the reflectance-adjustable reflector 100 may be a non-polarized light. Namely, the light B includes P polarized light (marked as a double arrow) and S polarized light (marked as a circle with an X in the middle). Since a polarization direction of the P polarized light is parallel to the reflection axis A120 of the first polarizer 120, and a polarization direction of the S polarized light is vertical to the reflection axis A120 of the first polarizer 120, the P polarized light is reflected by the first polarizer 120 (the light reflected by the first polarizer 120 is marked as B1) while the S polarized light passes the first polarizer 120 (the light passes the first polarizer 120 is marked as B2). Under the condition that the reflection axis A120 of the first polarizer 120 is vertical to the reflection axis A130 of the second polarizer 130, no phase difference is provided by the phase modulation layer PM in the high reflectance mode, thus the S polarized light passes the phase modulation layer PM without change in polarization direction. Since the polarization direction of the S polarized light is parallel to the reflection axis A130 of the second polarizer 130, the S polarized light is then reflected by the second polarizer 130 and transmitted back to the phase modulation element 110. The S polarized light passes the phase modulation layer PM again without change in polarization direction and then passes the first polarizer 120. In the high reflectance mode, the sum of the light reflected by the reflectance-adjustable reflector 100 (including the light B1 reflected by the first polarizer 120 and the light B2 reflected by the second polarizer 130 and output from the reflectance-adjustable reflector 100) is about 95% of the light B incident on the reflectance-adjustable reflector 100, wherein 5% loss is mainly because the reflectance of the second polarizer 130 does not reach 100% in general.

On the other hand, as shown in FIG. 1B, under the condition that the reflection axis A120 of the first polarizer 120 is vertical to the reflection axis A130 of the second polarizer 130, a half wavelength phase difference is provided by the phase modulation layer PM in the low reflectance mode, thus the S polarized light passing the first polarizer 120 is turned into the P polarized light after passing the phase modulation layer PM. Since the polarization direction of the P polarized light is vertical to the reflection axis A130 of the second polarizer 130, the P polarized light then passes the second polarizer 130. In the low reflectance mode, the sum of the light beam reflected by the reflectance-adjustable reflector 100 (i.e. the light B1 reflected by the first polarizer 120) is about 50% of the light B incident on the reflectance-adjustable reflector 100.

Based on the above, the reflectance of the reflectance-adjustable reflector 100 of the embodiment may be switched between the high reflectance mode (95% reflectance) and the low reflectance mode (50% reflectance). Since liquid crystal molecules of the liquid crystal layer (the phase modulation layer PM) have fast response time, the reflectance-adjustable reflector 100 may quickly render ideal reflectance to adapt to the environment. Take the reflectance-adjustable reflector 100 being applied as a rearview mirror as an example, the reflectance-adjustable reflector 100 may be quickly switched to the high reflectance mode when driving at daytime or to serve as a makeup mirror. On the other hand, the reflectance-adjustable reflector 100 may be quickly switched to the low reflectance mode when driving at night, to prevent the driver from suffering the impact of glare owning to the reflectance-adjustable reflector 100 being subject to the strong light from the vehicle in the back.

It is noted that the high reflectance mode and the low reflectance mode can be switched manually or automatically. For example, a switching button may be made to allow the user to switch between the high reflectance mode and the low reflectance mode manually. Alternatively, a light sensor electrically connected to a controller (not shown) of the reflectance-adjustable reflector 100 may be provided to sense the intensity of light incident on the reflectance-adjustable reflector 100, such that the high reflectance mode and the low reflectance mode may be switched automatically.

Moreover, since the thicknesses (HSUB1 and HSUB2) of the first substrate SUB1 and the second substrate SUB2 are between 0.01 mm and 0.5 mm, and a total thickness of the phase modulation element 110 and the first polarizer 120 is less than 1 mm, a lateral distance between the light B1 reflected by the first polarizer 120 and the light B2 reflected by the second polarizer 130 and output from the reflectance-adjustable reflector 100 in FIG. 1A is reduced. Therefore, ghost image phenomenon can be avoided, and thereby improving the quality of the displayed image. Specifically, when the light B obliquely incident on the reflectance-adjustable reflector 100, the lateral distance between the light B1 reflected by the first polarizer 120 and the light B2 reflected by the second polarizer 130 and output from the reflectance-adjustable reflector 100 is proportional to a longitudinal distance between reflection surfaces of the light B1 and the light B2. The longitudinal distance between reflection surfaces of the light B1 and the light B2 refers to the longitudinal distance between the top surface of the first polarizer 120 and the top surface of the second polarizer 130, which is also the total thickness of the phase modulation element 110 and the first polarizer 120.

In FIG. 2A and FIG. 2B, the reflectance-adjustable reflector 100 is placed next to an object (a grid pattern P on the top of FIG. 2A and FIG. 2B) to observe whether a ghost image exists in the displayed image RI (i.e. the image reflected by the reflectance-adjustable reflector 100) or not. In the reflectance-adjustable reflector 100 of FIG. 2A, the thicknesses (HSUB1 and HSUB2) of the first substrate SUB1 and the second substrate SUB2 are greater than 0.5 mm, thus a total thickness of the phase modulation element 110 and the first polarizer 120 is greater than 1 mm. In the reflectance-adjustable reflector 100 of FIG. 2B, the thicknesses (HSUB1 and HSUB2) of the first substrate SUB1 and the second substrate SUB2 are less than 0.5 mm, and a total thickness of the phase modulation element 110 and the first polarizer 120 is less than 1 mm. Theoretically, the pattern of the displayed image RI and the grid pattern P shall be the same; however, it is very clear that there are a plurality of pale thin lines (the ghost image GI) respectively located next to the thick solid line (the reflection of the grid pattern P) in the displayed image RI of the reflectance-adjustable reflector 100 in FIG. 2A. This is because the thicker the substrates (the first substrate SUB1 and the second substrate SUB2), the bigger the lateral distance between the light B1 reflected by the first polarizer 120 and the light B2 reflected by the second polarizer 130 and output from the reflectance-adjustable reflector 100, thereby results in the ghost image GI visible to human eyes. On the contrary, by controlling the thickness HSUB1 of the first substrate SUB1, the thickness HSUB2 of the second substrate SUB2, and the total thickness of the phase modulation element 110 and the first polarizer 120, the ghost image phenomenon can be avoided in the displayed image RI of the reflectance-adjustable reflector 100 in FIG. 2B.

Hereinafter, other embodiments of the reflectance-adjustable reflector are described with reference to FIG. 3A to FIG. 7B, wherein the same components are labeled with the same reference numerals. Thus, description of the materials, relative configuration, and effects thereof are not repeated hereinafter.

Figure 3A:
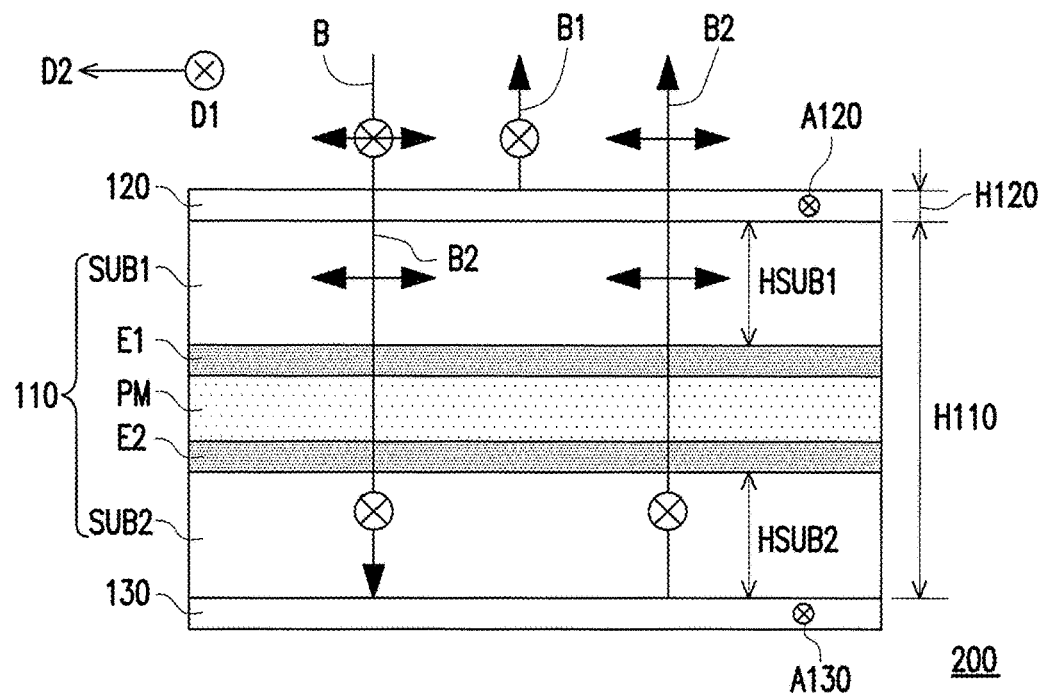
FIG. 3A and FIG. 3B are schematic diagrams illustrating a reflectance-adjustable reflector according to a second embodiment of the invention in a high reflectance mode and a low reflectance mode respectively.
Figure 3B:
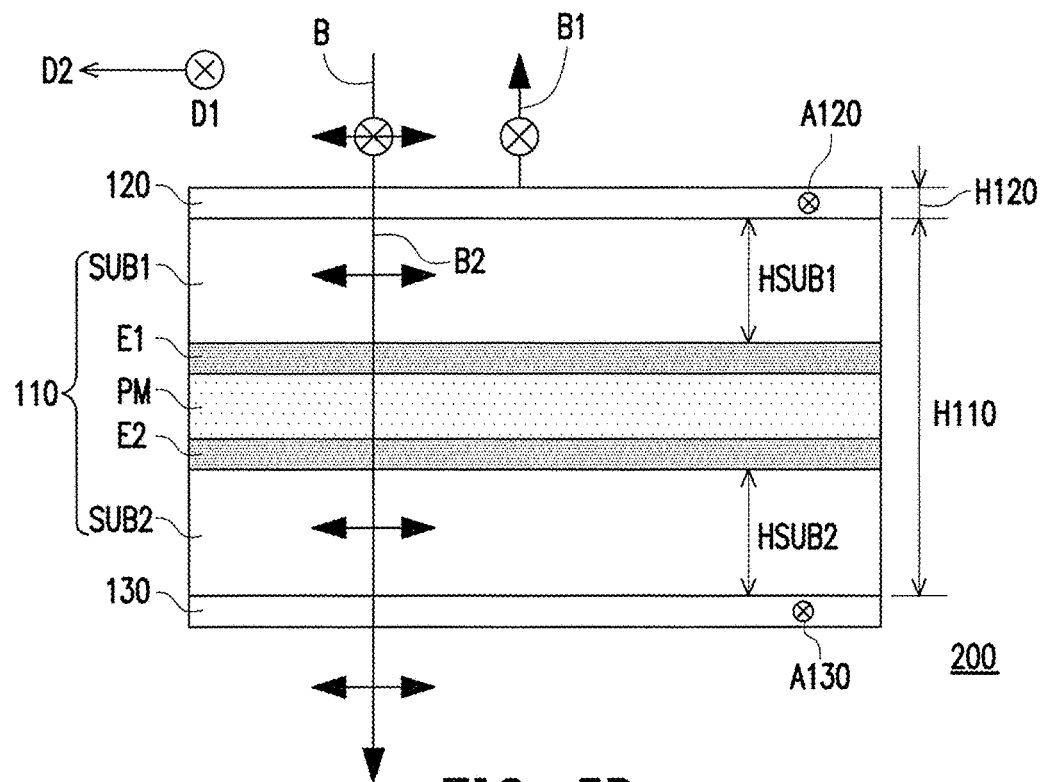
Figure 4:
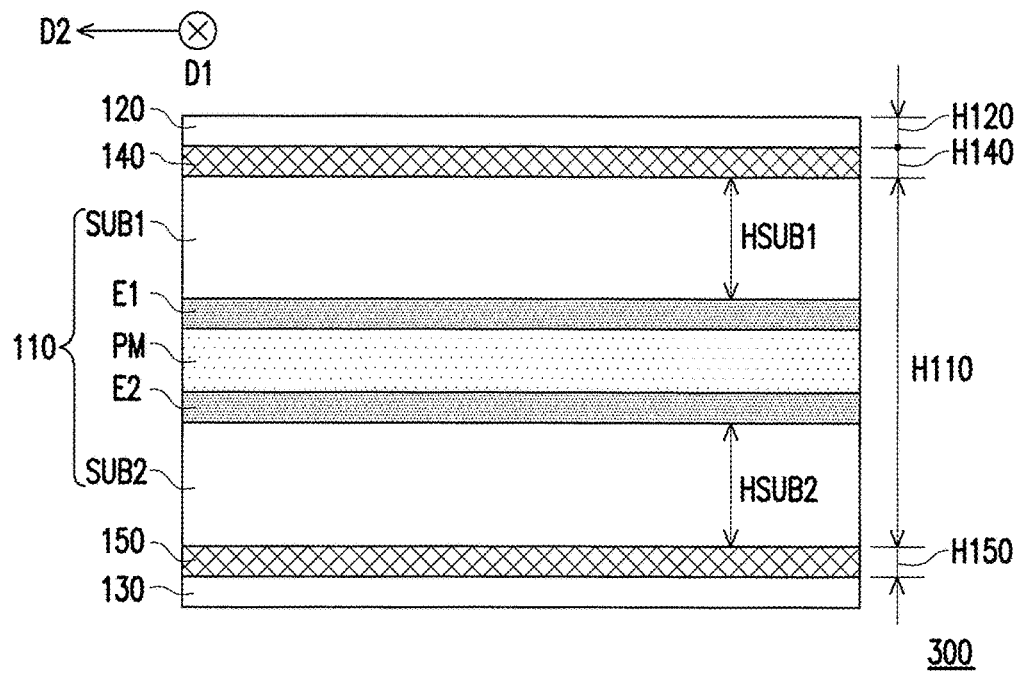
FIG. 4 is a schematic diagram illustrating a reflectance-adjustable reflector according to a third embodiment of the invention.
Figure 5:
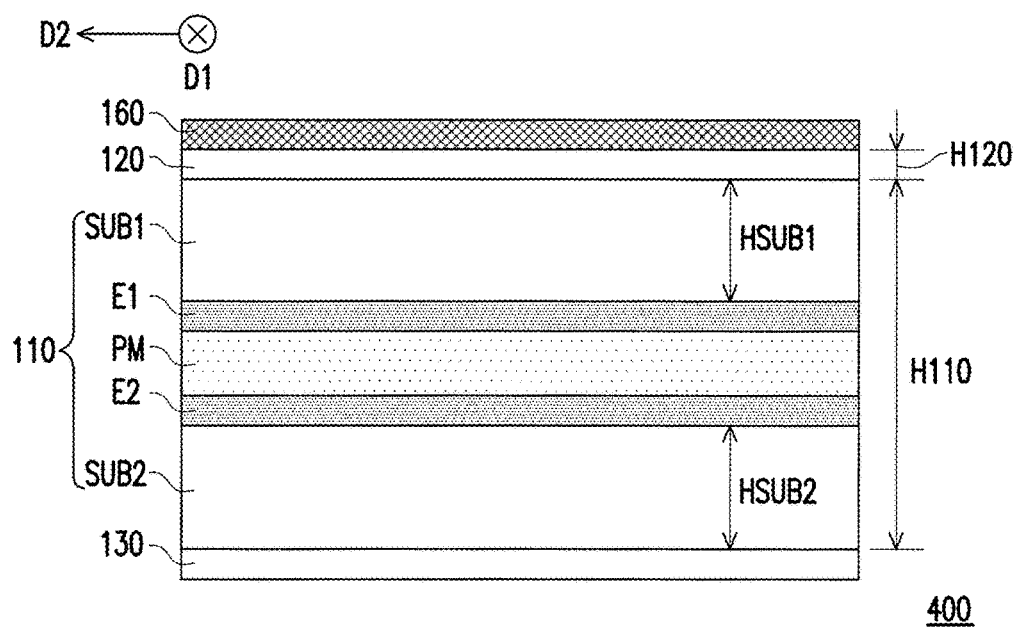
FIG. 5 is a schematic diagram illustrating a reflectance-adjustable reflector according to a fourth embodiment of the invention.
Figure 6A:
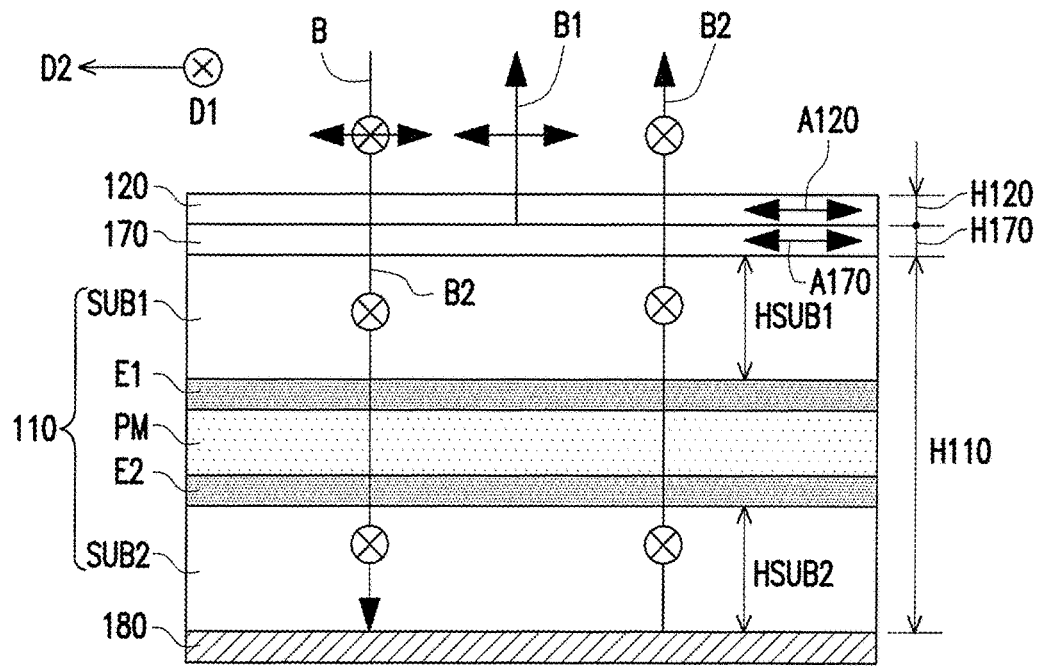
FIG. 6A and FIG. 6B are schematic diagrams illustrating a reflectance-adjustable reflector according to a fifth embodiment of the invention in a high reflectance mode and a low reflectance mode respectively.
Figure 6B:
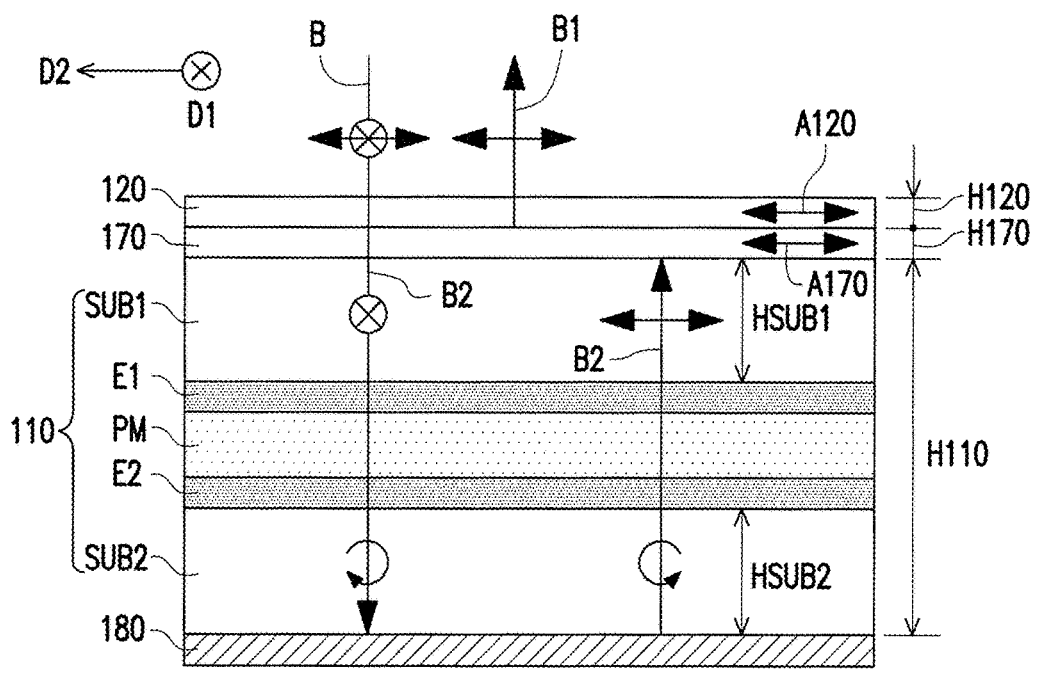
Figure 7A:
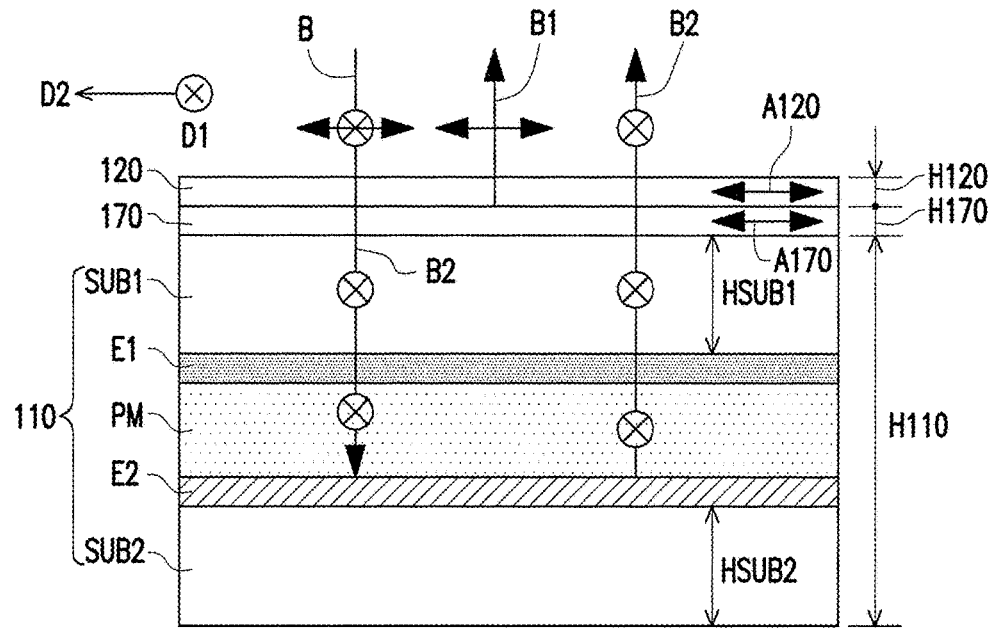
FIG. 7A and FIG. 7B are schematic diagrams illustrating a reflectance-adjustable reflector according to a sixth embodiment of the invention in a high reflectance mode and a low reflectance mode respectively.
Figure 7B:
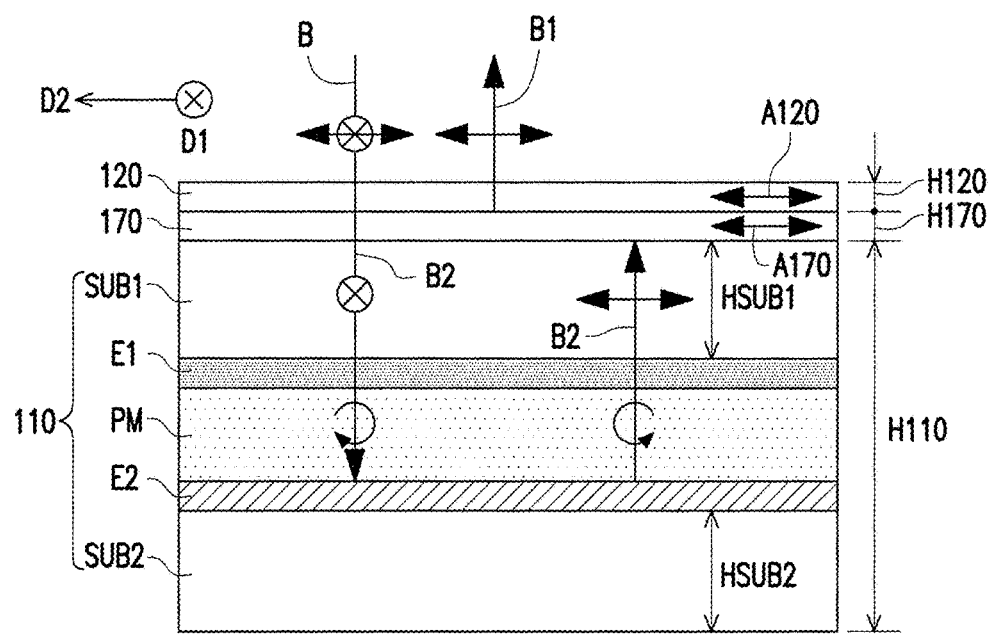

FIG. 3A and FIG. 3B are schematic diagrams illustrating a reflectance-adjustable reflector according to a second embodiment of the invention in a high reflectance mode and a low reflectance mode respectively. FIG. 4 is a schematic diagram illustrating a reflectance-adjustable reflector according to a third embodiment of the invention. FIG. 5 is a schematic diagram illustrating a reflectance-adjustable reflector according to a fourth embodiment of the invention. FIG. 6A and FIG. 6B are schematic diagrams illustrating a reflectance-adjustable reflector according to a fifth embodiment of the invention in a high reflectance mode and a low reflectance mode respectively. FIG. 7A and FIG. 7B are schematic diagrams illustrating a reflectance-adjustable reflector according to a sixth embodiment of the invention in a high reflectance mode and a low reflectance mode respectively.

Referring to FIG. 3A and FIG. 3B, the main difference between the reflectance-adjustable reflector 200 and the reflectance-adjustable reflector 100 in FIG. 1A and FIG. 1B is as follow. In the reflectance-adjustable reflector 200, the reflection axis A120 of the first polarizer 120 is parallel to the reflection axis A130 of the second polarizer 130, wherein extension directions of the reflection axis A120 and the reflection axis A130 are both parallel to the first direction D1, but the invention is not limited thereto. Alternatively, extension directions of the reflection axis A120 and the reflection axis A130 may both parallel to the second direction D2.

In the high reflectance mode, as shown in FIG. 3A, since the polarization direction of the S polarized light (marked as a circle with an X in the middle) is parallel to the reflection axis A120 of the first polarizer 120, and the polarization direction of the P polarized light (marked as a double arrow) is vertical to the reflection axis A120 of the first polarizer 120, the S polarized light is reflected by the first polarizer 120 (the light reflected by the first polarizer 120 is marked as B1) while the P polarized light passes the first polarizer 120 (the light passes the first polarizer 120 is marked as B2). Under the condition that the reflection axis A120 of the first polarizer 120 is parallel to the reflection axis A130 of the second polarizer 130, a half wavelength phase difference is provided by the phase modulation layer PM in the high reflectance mode, thus the P polarized light passing the first polarizer 120 is turned into the S polarized light after passing the phase modulation layer PM. Since the polarization direction of the S polarized light is parallel to the reflection axis A130 of the second polarizer 130, the S polarized light is then reflected by the second polarizer 130 and transmitted back to the phase modulation element 110. The S polarized light reflected by the second polarizer 130 is turned into the P polarized light after passing the phase modulation layer PM, and the P polarized light then passes the first polarizer 120. In the high reflectance mode, the sum of the light reflected by the reflectance-adjustable reflector 200 (including the light B1 reflected by the first polarizer 120 and the light B2 reflected by the second polarizer 130 and output from the reflectance-adjustable reflector 200) is about 95% of the light B incident on the reflectance-adjustable reflector 200.

On the other hand, as shown in FIG. 3B, under the condition that the reflection axis A120 of the first polarizer 120 is parallel to the reflection axis A130 of the second polarizer 130, no phase difference is provided by the phase modulation layer PM in the low reflectance mode, thus the P polarized light passing the first polarizer 120 passes the phase modulation layer PM without change in polarization direction. Since the polarization direction of the P polarized light is vertical to the reflection axis A130 of the second polarizer 130, the P polarized light passing the phase modulation layer PM then passes the second polarizer 130. In the low reflectance mode, the sum of the light reflected by the reflectance-adjustable reflector 200 (i.e. the light B1 reflected by the first polarizer 120) is about 50% of the light B incident on the reflectance-adjustable reflector 200.

Referring to FIG. 4, the main difference between the reflectance-adjustable reflector 300 and the reflectance-adjustable reflector 100 in FIG. 1A and FIG. 1B is as follow. In the reflectance-adjustable reflector 300, the reflectance-adjustable reflector 300 further includes a first phase compensation layer 140 and a second phase compensation layer 150. The first phase compensation layer 140 is located between the first polarizer 120 and the first substrate SUB1. The second phase compensation layer 150 is disposed under the second substrate SUB2, wherein the second substrate SUB2 is located between the second phase compensation layer 150 and the second electrode layer E2, and the second phase compensation layer 150 is located between the second polarizer 130 and the second substrate SUB2. Since liquid crystal molecules of the liquid crystal layer (the phase modulation layer PM) are not isotropic, reflectance at different viewing angles vary in accordance with different orientations of liquid crystal molecules. Since the first phase compensation layer 140 and the second phase compensation layer 150 are adapted to compensate the reflectance difference between different viewing angles, consistency of the reflectance of the reflectance-adjustable reflector 300 at each of the viewing angles may be enhanced.

Besides, a total thickness of the phase modulation element 110, the first polarizer 120, the first phase compensation layer 140, and the second phase compensation layer 150 (i.e. the sum of the thickness H110 of the phase modulation element 110, the thickness and H120 of the first polarizer 120, a thickness H140 of the first phase compensation layer 140, and a thickness H150 of the second phase compensation layer 150) is less than 1 mm, so as to reduce the lateral distance between the light reflected by the first polarizer 120 and the light reflected by the second polarizer 130 and output from the reflectance-adjustable reflector 300. Therefore, ghost image phenomenon can be avoided, and thereby improving the quality of the displayed image.

In the embodiment, the reflection axes (not shown) of the first polarizer 120 and the second polarizer 130 may be vertical or parallel to each other. Alternatively, the first polarizer 120 may be an absorption-type polarizing film and an absorption axis thereof is parallel or vertical to the reflection axis A130.

Referring to FIG. 5, the main difference between the reflectance-adjustable reflector 400 and the reflectance-adjustable reflector 100 in FIG. 1A and FIG. 1B is as follow. In the reflectance-adjustable reflector 400, the reflectance-adjustable reflector 400 further includes a light absorbing layer 160 disposed on the first polarizer 120, wherein the first polarizer 120 is located between the light absorbing layer 160 and the first substrate SUB1. Since the light absorbing layer 160 is adapted to absorb the light incident on the reflectance-adjustable reflector 400, the reflectance of the reflectance-adjustable reflector 400 may be reduced, and thus the anti-glare effect may be enhanced. The light absorbing layer 160 may have 10% absorption rate, but the invention is not limited thereto. For example, a material of the light absorbing layer 160 includes dye, ink, etc. In another embodiment, the light absorbing layer 160 may be replaced by a light absorption-adjustable layer. The light absorption-adjustable layer may include a photochromic layer or an electrochromic layer, but the invention is not limited thereto.

In the embodiment, the reflection axes (not shown) of the first polarizer 120 and the second polarizer 130 may be vertical or parallel to each other. Alternatively, the first polarizer 120 may be an absorption-type polarizing film and an absorption axis thereof is parallel or vertical to the reflection axis A130.

Referring to FIG. 6A and FIG. 6B, the main differences between the reflectance-adjustable reflector 500 and the reflectance-adjustable reflector 100 in FIG. 1A and FIG. 1B are as follow. In the reflectance-adjustable reflector 500, the first polarizer 120 is a reflection-type polarizing film, and the reflectance-adjustable reflector 500 further includes an absorption-type polarizing film 170 located between the first polarizer 120 and the first substrate SUB1. The absorption-type polarizing film 170 has an absorption axis A170 parallel to the reflection axis A120 of the first polarizer 120. Moreover, the reflectance-adjustable reflector 500 may further include a reflective layer 180 disposed under the second substrate SUB2, wherein the second substrate SUB2 is located between the reflective layer 180 and the second electrode layer E2.

In the high reflectance mode, as shown in FIG. 6A, since the polarization direction of the P polarized light (marked as a double arrow) is parallel to the reflection axis A120 of the first polarizer 120, and the polarization direction of the S polarized light (marked as a circle with an X in the middle) is vertical to the reflection axis A120 of the first polarizer 120 and the absorption axis A170 of the absorption-type polarizing film 170, the P polarized light is reflected by the first polarizer 120 (the light reflected by the first polarizer 120 is marked as B1) while the S polarized light sequentially passes the first polarizer 120 and the absorption-type polarizing film 170 (the light passes the first polarizer 120 and the absorption-type polarizing film 170 is marked as B2). Under the condition that the second polarizer 130 in FIG. 1A and FIG. 1B is replaced by the reflective layer 180, no phase difference is provided by the phase modulation layer PM in the high reflectance mode, thus the P polarized light passes the phase modulation layer PM without change in polarization direction. After reflected by the reflective layer 180, the P polarized light then sequentially passes the phase modulation element 110, the absorption-type polarizing film 170, and the first polarizer 120. In the high reflectance mode, the sum of the light reflected by the reflectance-adjustable reflector 500 (including the light B1 reflected by the first polarizer 120 and the light B2 reflected by the reflective layer 180 and output from the reflectance-adjustable reflector 500) is about 95% of the light B incident on the reflectance-adjustable reflector 500.

On the other hand, as shown in FIG. 6B, under the condition that the second polarizer 130 in FIG. 1A and FIG. 1B is replaced by the reflective layer 180, a quarter wavelength phase difference is provided by the phase modulation layer PM in the low reflectance mode, thus the S polarized light passing the absorption-type polarizing film 170 is turned into dextrorotation light after passing the phase modulation layer PM. After reflected by the reflective layer 180, the dextrorotation light is turned into laevorotatory light, and the laevorotatory light is turned into the P polarized light after passing the phase modulation layer PM. Since the polarization direction of the P polarized light is parallel to the absorption axis A170 of the absorption-type polarizing film 170, the P polarized light is then absorbed by the absorption-type polarizing film 170. In the low reflectance mode, the sum of the light reflected by the reflectance-adjustable reflector 500 (i.e. the light B1 reflected by the first polarizer 120) is about 50% of the light B incident on the reflectance-adjustable reflector 500.

Besides, a total thickness of the phase modulation element 110, the first polarizer 120, and the absorption-type polarizing film 170 (i.e. the sum of the thickness H110 of the phase modulation element 110, the thickness and H120 of the first polarizer 120, and a thickness H170 of the absorption-type polarizing film 170) is less than 1 mm, so as to reduce the lateral distance between the light B1 reflected by the first polarizer 120 and the light B2 reflected by the reflective layer 180 and output from the reflectance-adjustable reflector 500 in FIG. 6A. Therefore, ghost image phenomenon can be avoided, and thereby improving the quality of the displayed image.

Referring to FIG. 7A and FIG. 7B, the main differences between the reflectance-adjustable reflector 600 and the reflectance-adjustable reflector 500 in FIG. 6A and FIG. 6B are as follow. In the reflectance-adjustable reflector 600, the second electrode layer E2 is a reflective electrode layer which is adapted to reflect the light beam B2 entering the phase modulation element 110. Thus, the reflective layer 180 in FIG. 6A and FIG. 6B is omitted. Namely, compared to the reflectance-adjustable reflector 500 in FIG. 6A and FIG. 6B, the cost of the reflectance-adjustable reflector 600 may be lower.

In the high reflectance mode, as shown in FIG. 7A, under the condition that the second electrode layer E2 is a reflective electrode layer, no phase difference is provided by the phase modulation layer PM in the high reflectance mode, thus the S polarized light passing the absorption-type polarizing film 170 passes the phase modulation layer PM without change in polarization direction. After reflected by the second electrode layer E2, the S polarized light then passes the phase modulation layer PM again without change in polarization direction. Since the polarization direction of the S polarized light is vertical to the absorption axis A170 of the absorption-type polarizing film 170 and the reflection axis A120 of the first polarizer 120, the S polarized light sequentially passes the absorption-type polarizing film 170 and the first polarizer 120. In the high reflectance mode, the sum of the light reflected by the reflectance-adjustable reflector 600 (including the light B1 reflected by the first polarizer 120 and the light B2 reflected by the second electrode layer E2 and output from the reflectance-adjustable reflector 600) is about 95% of the light B incident on the reflectance-adjustable reflector 600.

On the other hand, as shown in FIG. 7B, under the condition that the second electrode layer E2 is a reflective electrode layer, a quarter wavelength phase difference is provided by the phase modulation layer PM in the low reflectance mode, thus the S polarized light passing the absorption-type polarizing film 170 is turned into dextrorotation light after passing the phase modulation layer PM. After reflected by the second electrode layer E2, the dextrorotation light is turned into laevorotatory light, and the laevorotatory light is turned into the P polarized light after passing the phase modulation layer PM. Since the polarization direction of the P polarized light is parallel to the absorption axis A170 of the absorption-type polarizing film 170, the P polarized light is then absorbed by the absorption-type polarizing film 170. In the low reflectance mode, the sum of the light reflected by the reflectance-adjustable reflector 600 (i.e. the light B1 reflected by the first polarizer 120) is about 50% of the light B incident on the reflectance-adjustable reflector 600.

Since the longitudinal distance between the reflection surfaces of the light B1 and the light B2 (i.e. the longitudinal distance between the top surface of the first polarizer 120 and the top surface of the second electrode layer E2) is reduced (compared to the reflectance-adjustable reflector 500 in FIG. 6A and FIG. 6B), the lateral distance between the light B1 reflected by the first polarizer 120 and the light B2 reflected by the second electrode layer E2 and output from the reflectance-adjustable reflector 600 is reduced accordingly. Therefore, the ghost image phenomenon can be avoided, and thereby improving the quality of the displayed image.

Figure 8A:
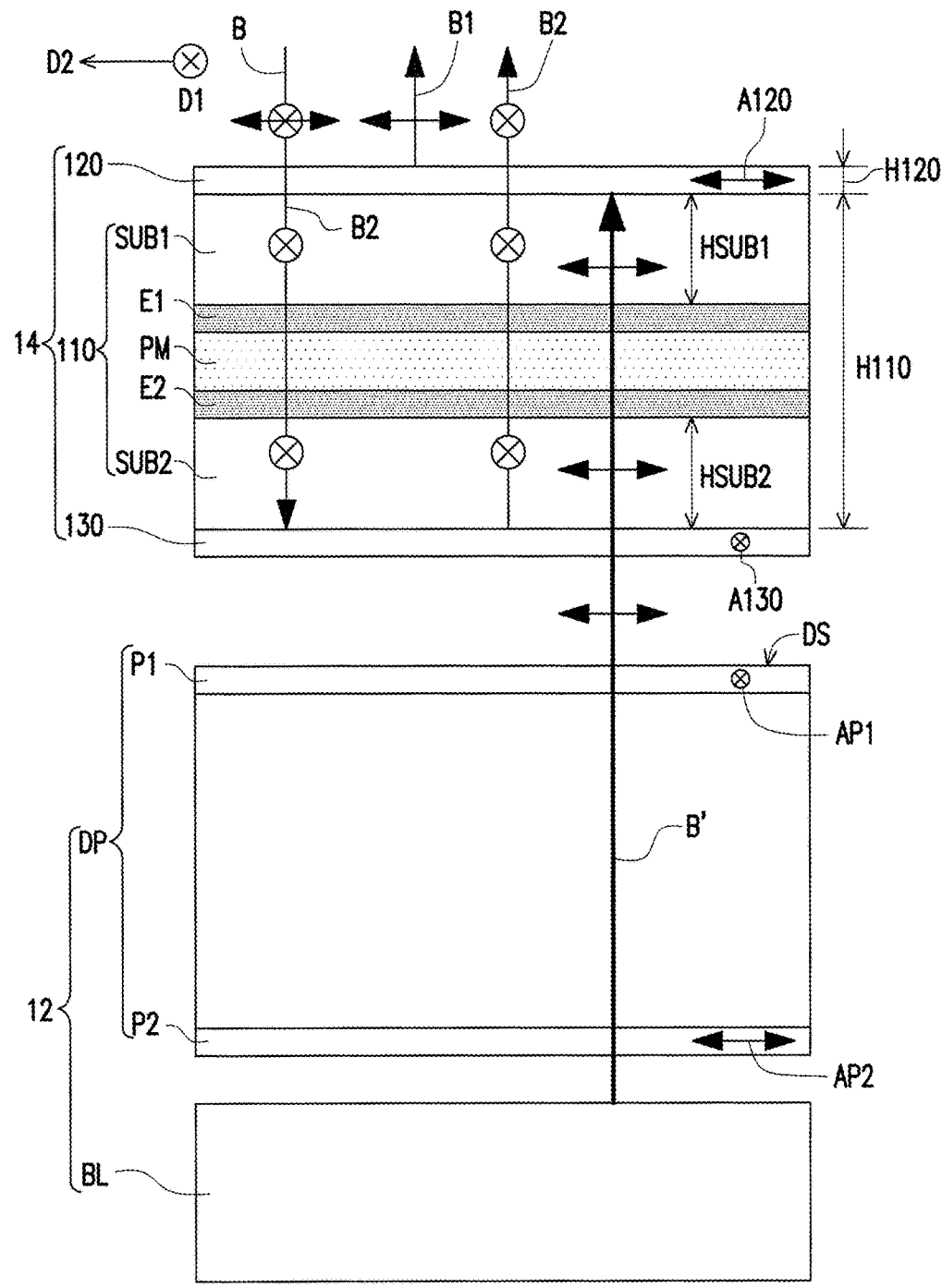
FIG. 8A and FIG. 8B are schematic diagrams illustrating a reflectance-adjustable display device according to a first embodiment of the invention in a high reflectance mode and a low reflectance mode respectively.
Figure 8B:
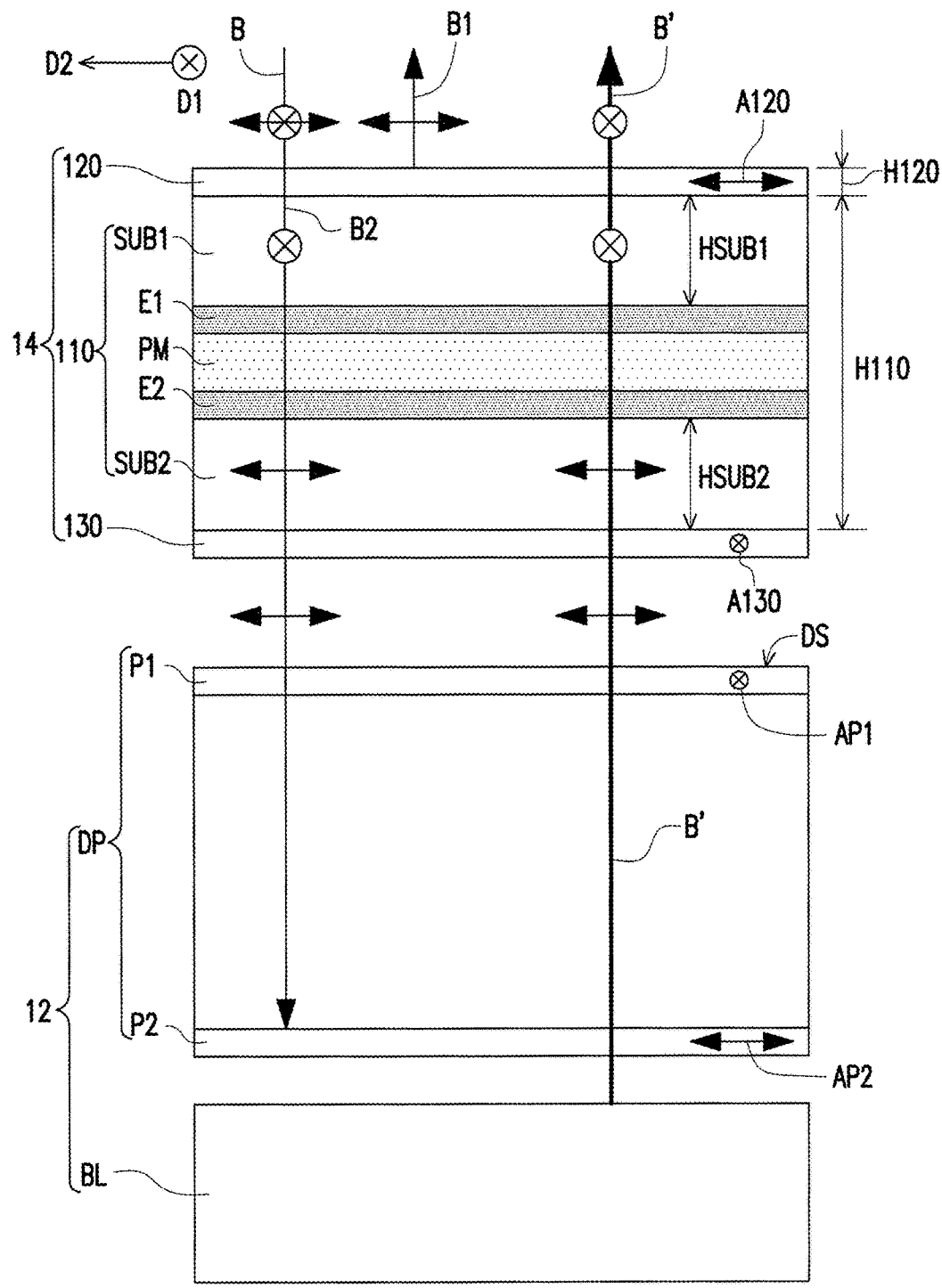

FIG. 8A and FIG. 8B are schematic diagrams illustrating a reflectance-adjustable display device according to a first embodiment of the invention in a high reflectance mode and a low reflectance mode respectively. Referring to FIG. 8A and FIG. 8B, a reflectance-adjustable display device 10 includes a display device 12 and a reflectance-adjustable reflector 14.

The display device 12 is, for example, a liquid crystal display device and comprises a backlight module BL and a display panel DP located between the reflectance-adjustable reflector 14 and the backlight module BL. The display panel DP may include a top polarizer P1 and a bottom polarizer P2. The top polarizer P1 and the bottom polarizer P2 may be absorption-type polarizing films, wherein absorption axes (AP1 and AP2) of the top polarizer P1 and the bottom polarizer P2 may be vertical to each other. For example, the absorption axis AP1 of the top polarizer P1 is parallel to the first direction D1, and the absorption axis AP2 of the bottom polarizer P2 is parallel to the second direction D2. However, the invention is not limited thereto. Alternatively, extension directions of the absorption axis AP1 and the absorption axis AP2 may be switched. In another embodiment, the absorption axis AP1 may be parallel to the absorption axis AP2, and extension directions of the absorption axis AP1 and the absorption axis AP2 may be parallel to the first direction D1 or the second direction D2. The display device 12 has a display surface DS. The display surface DS of the display device 12 is, for example, a top surface of the top polarizer P1, but the invention is not limited thereto.

The reflectance-adjustable reflector 14 is located on the display surface DS. In the embodiment, the reflectance-adjustable reflector 14 adopts the configuration of the reflectance-adjustable reflector 100 in FIG. 1A and FIB. 1B, wherein the second substrate SUB2 is located between the display device 12 and the first substrate SUB1. The same components are labeled with the same reference numerals. Thus, description of the materials, relative configuration, and effects thereof are not repeated hereinafter. In another embodiment, the reflectance-adjustable reflector 14 may adopt the configuration of the reflectance-adjustable reflector 200 in FIG. 3A and FIB. 3B, the reflectance-adjustable reflector 300 in FIG. 4, or the reflectance-adjustable reflector 400 in FIG. 5. The reflectance-adjustable reflector 14 in the embodiment of FIG. 9A and FIG. 9B and the embodiment of FIG. 10A and FIG. 10B may also adopt the configuration of the reflectance-adjustable reflector 200 in FIG. 3A and FIB. 3B, the reflectance-adjustable reflector 300 in FIG. 4, or the reflectance-adjustable reflector 400 in FIG. 5, thus the same description will not be repeated hereinafter.

In the embodiment, the reflection axis A130 of the second polarizer 130 is parallel to the absorption axis AP1 of the top polarizer P1, so that the light B' from the display device 12 may pass the second polarizer 130. In detail, a polarization direction of the light B' from the top polarizer P1 shall be vertical to absorption axis AP1, therefore, the light B' is P polarized light. Since the P polarized light is vertical to the reflection axis A130 of the second polarizer 130, the light B' passes the second polarizer 130 in both of the high reflectance mode and the low reflectance mode. However, the invention is not limited to the above. In another embodiment, the reflection axis A130 of the second polarizer 130 may be vertical to the absorption axis AP1 of the top polarizer P1, and the reflectance-adjustable display device 10 may further includes a half wave plate (not shown) located between the display device 12 and the reflectance-adjustable reflector 14, so that the light B' from the display device 12 may pass the second polarizer 130.

In the high reflectance mode, as shown in FIG. 8A, under the condition that the reflection axis A120 of the first polarizer 120 is vertical to the reflection axis A130 of the second polarizer 130, no phase difference is provided by the phase modulation layer PM in the high reflectance mode, thus the light B' (P polarized light) passes the phase modulation layer PM without change in polarization direction. Since the polarization direction of the light B' (P polarized light) is parallel to the reflection axis A120 of the first polarizer 120, the light B' is then reflected by the first polarizer 120 (the light reflected by the first polarizer 120 is not shown). Namely, the light B' from the display device 12 will not be perceived by the user in the high reflectance mode.

On the other hand, as shown in FIG. 8B, under the condition that the reflection axis A120 of the first polarizer 120 is vertical to the reflection axis A130 of the second polarizer 130, a half wavelength phase difference is provided by the phase modulation layer PM in the low reflectance mode, thus the light B' (P polarized light) passing the second polarizer 130 is turned into the S polarized light after passing the phase modulation layer PM. Since the polarization direction of the S polarized light is vertical to the reflection axis A120 of the first polarizer 120, the light B' passing the phase modulation layer PM passes the first polarizer 120. Namely, the light B' from the display device 12 will be perceived by the user in the low reflectance mode.

In the low reflectance mode, it is noted that the light B2 passing the second polarizer 130 and transmitted to the display device 12 will be absorbed by the bottom polarizer P2 or depolarized by the backlight module BL, thus the amount of the light B2 output from the reflectance-adjustable display device 10 from the first polarizer 120 will be very small and can be neglected.

Figure 9A:
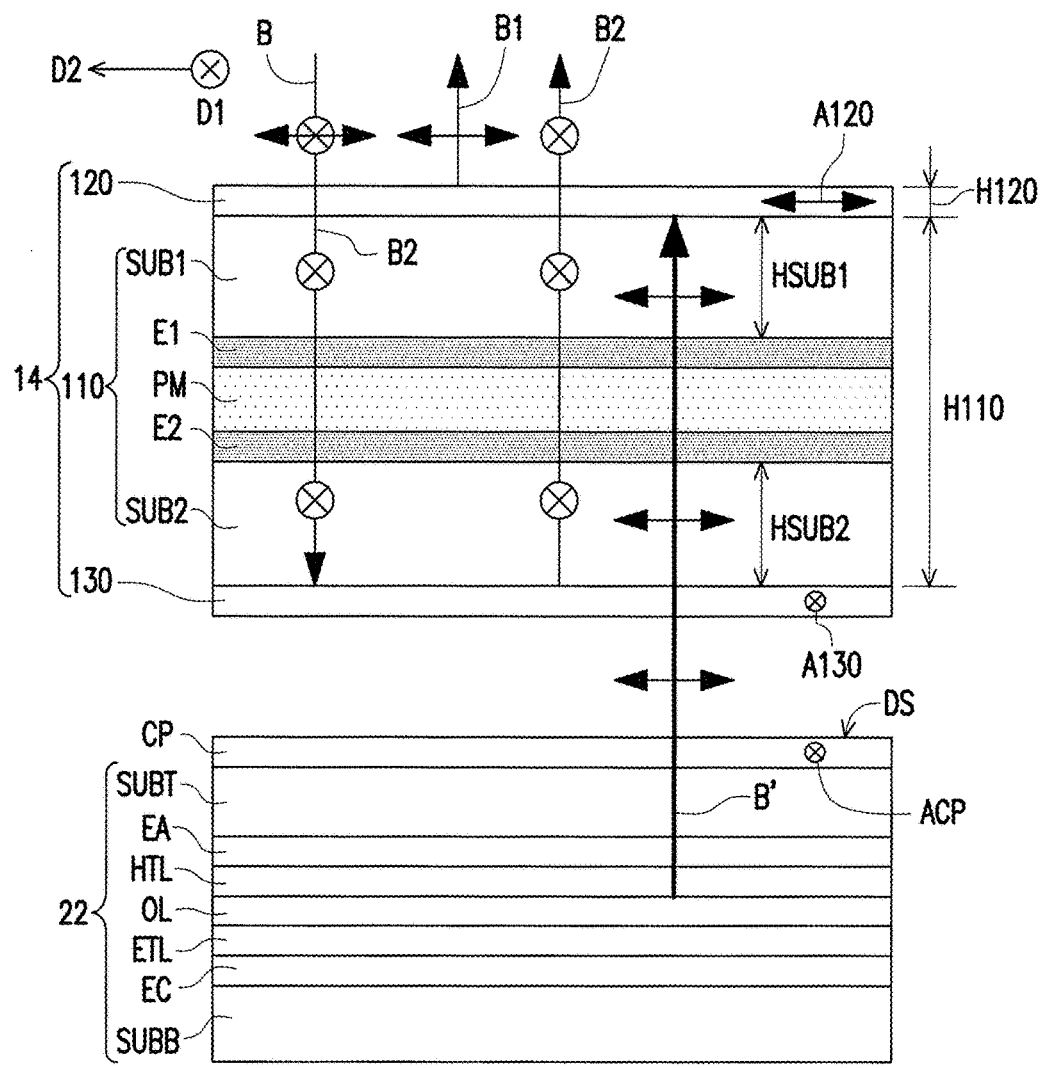
FIG. 9A and FIG. 9B are schematic diagrams illustrating a reflectance-adjustable display device according to a second embodiment of the invention in a high reflectance mode and a low reflectance mode respectively.
Figure 9B:
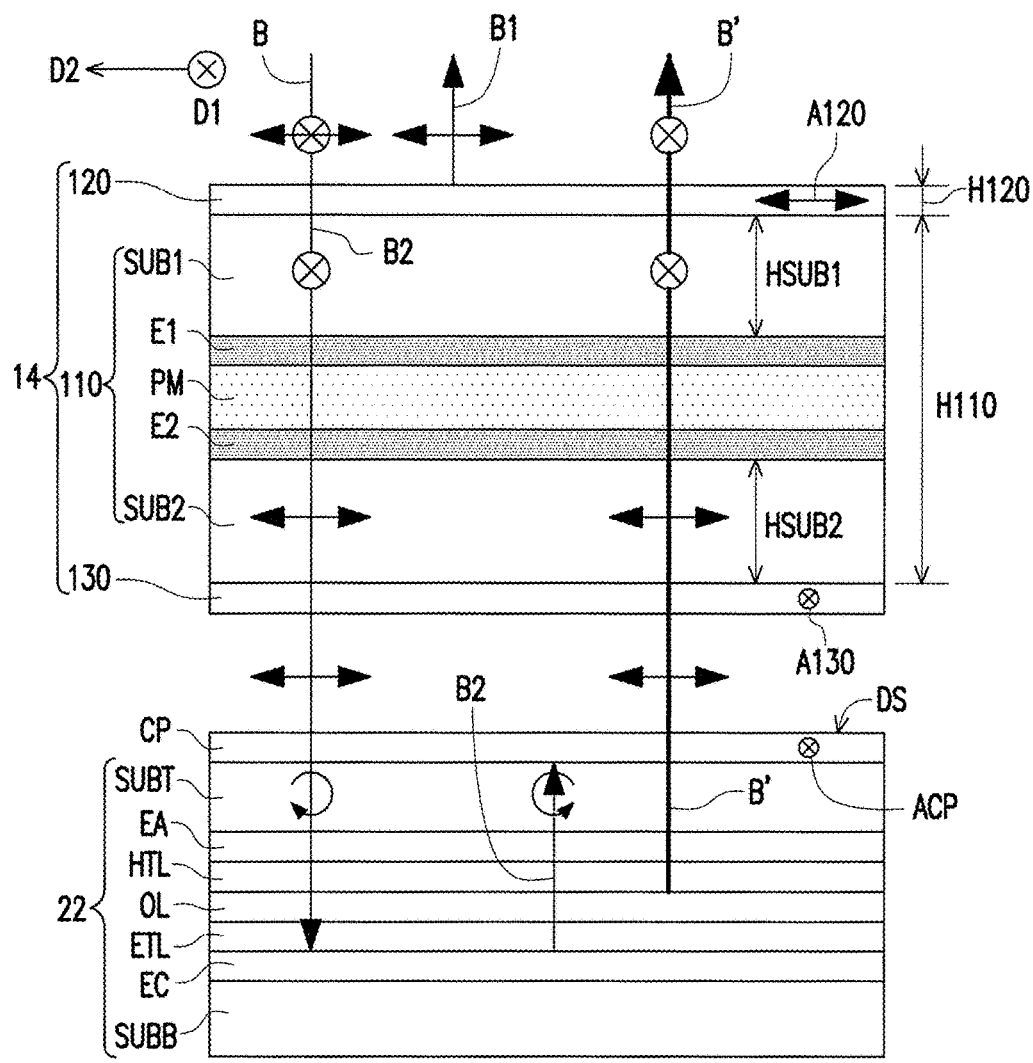
Figure 10A:
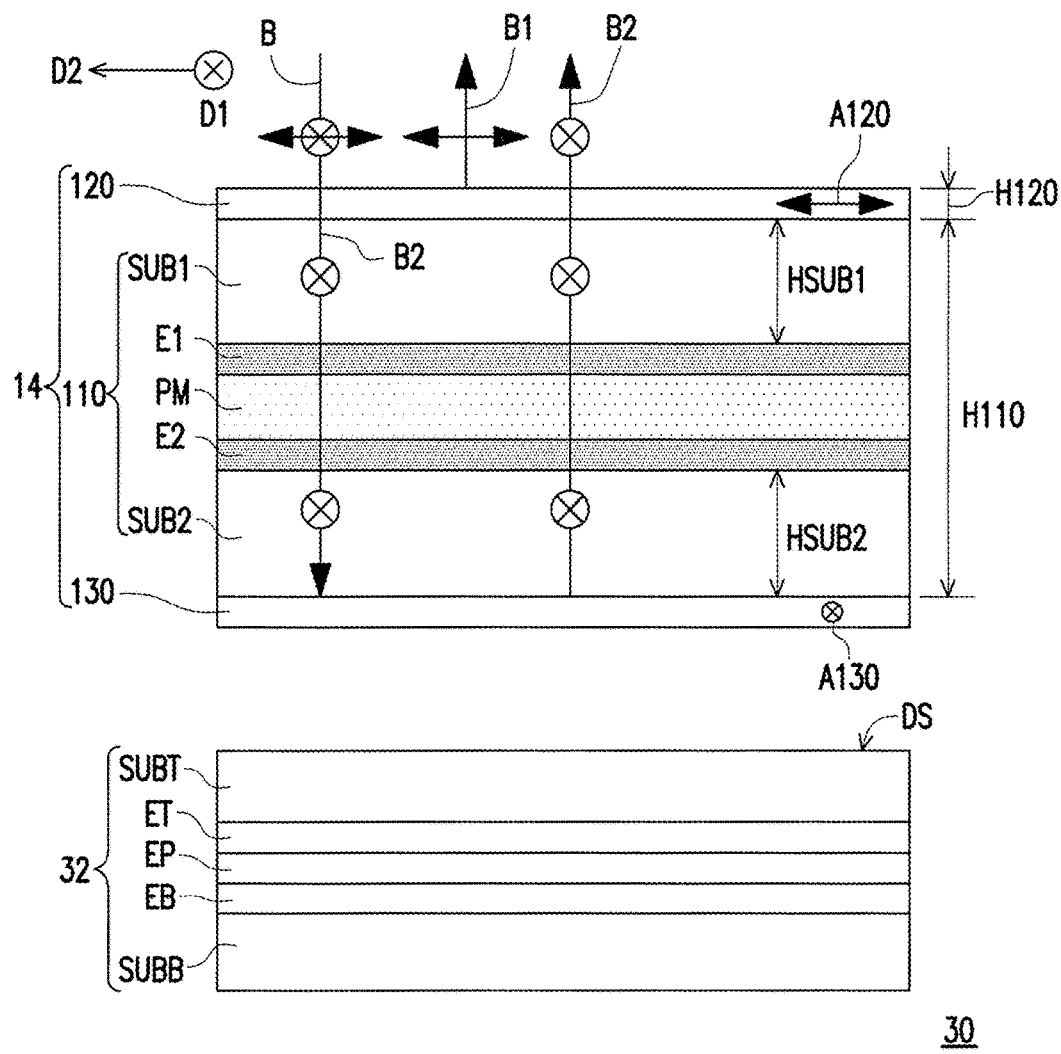
FIG. 10A and FIG. 10B are schematic diagrams illustrating a reflectance-adjustable display device according to a third embodiment of the invention in a high reflectance mode and a low reflectance mode respectively.
Figure 10B:
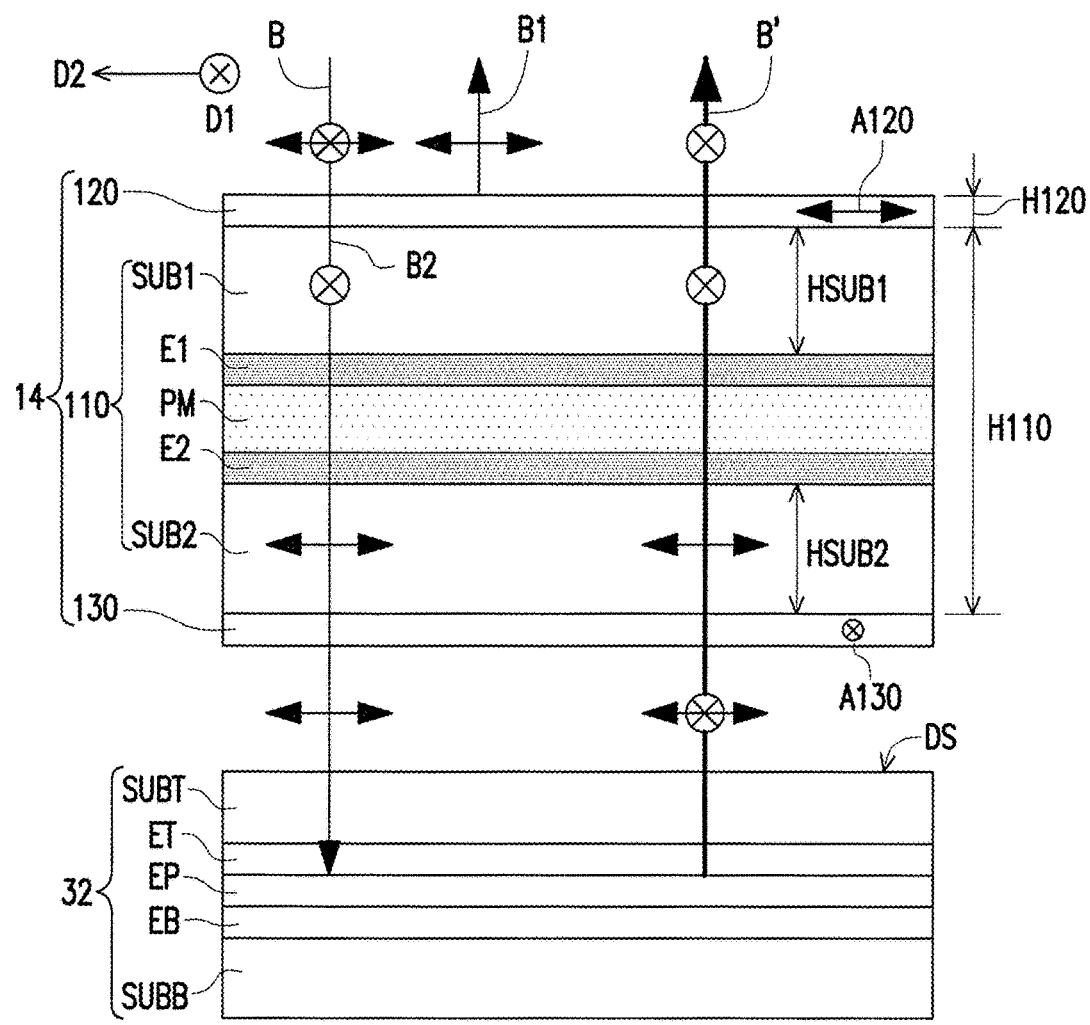
Figure 11A:
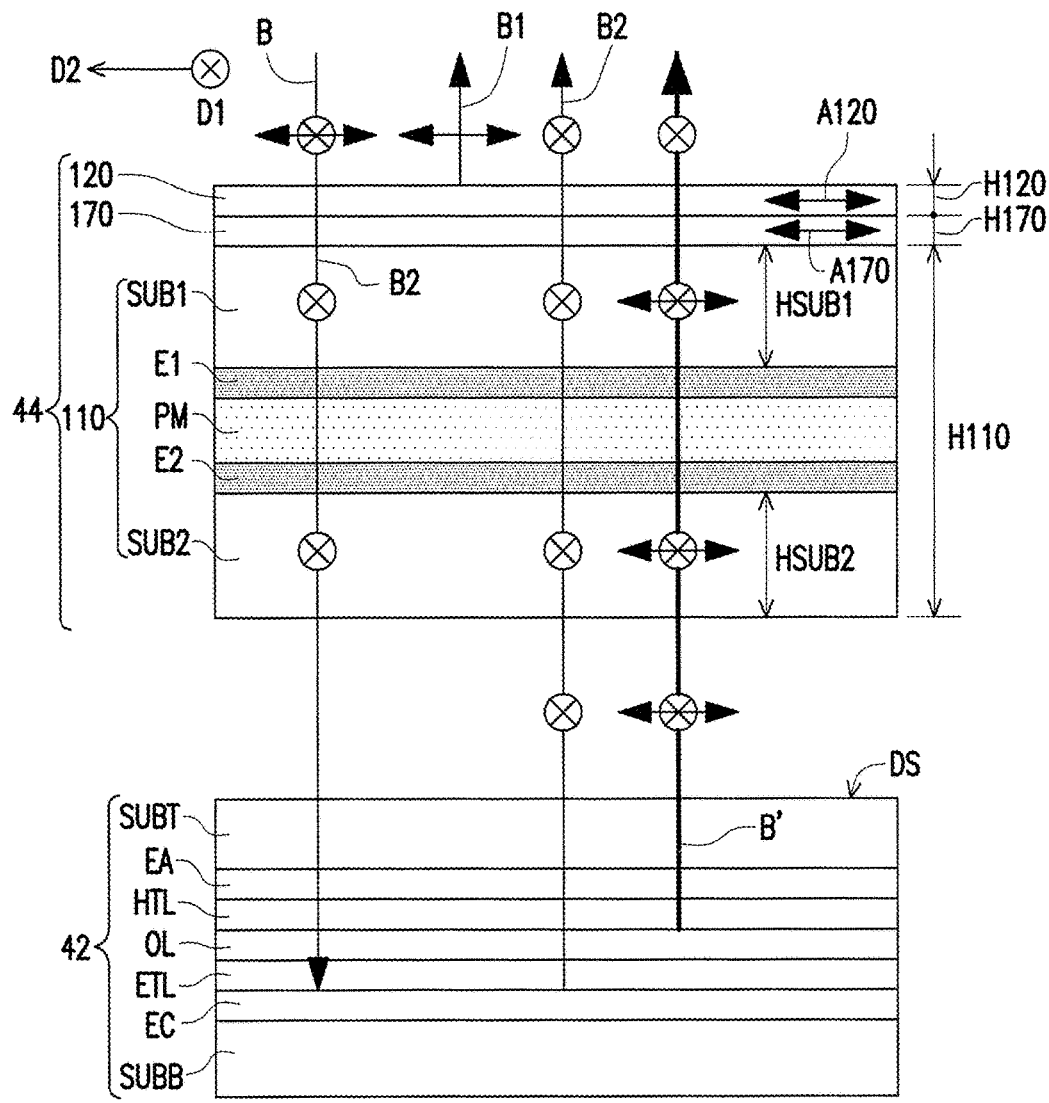
FIG. 11A and FIG. 11B are schematic diagrams illustrating a reflectance-adjustable display device according to a fourth embodiment of the invention in a high reflectance mode and a low reflectance mode respectively.
Figure 11B:
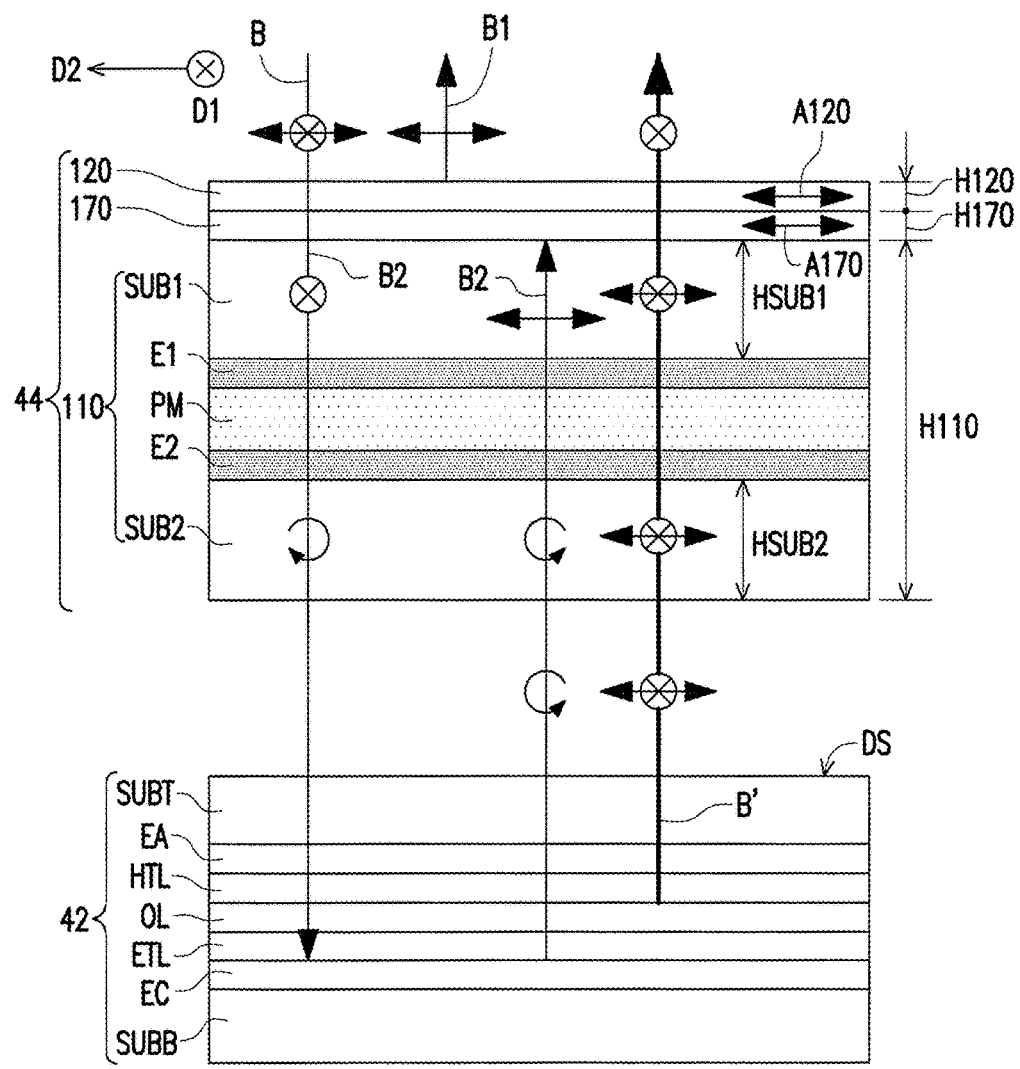

Hereinafter, other embodiments of the reflectance-adjustable display device are described with reference to FIG. 9A to FIG. 11B, wherein the same components are labeled with the same reference numerals. Thus, description of the materials, relative configuration, and effects thereof are not repeated hereinafter. FIG. 9A and FIG. 9B are schematic diagrams illustrating a reflectance-adjustable display device according to a second embodiment of the invention in a high reflectance mode and a low reflectance mode respectively. FIG. 10A and FIG. 10B are schematic diagrams illustrating a reflectance-adjustable display device according to a third embodiment of the invention in a high reflectance mode and a low reflectance mode respectively. FIG. 11A and FIG. 11B are schematic diagrams illustrating a reflectance-adjustable display device according to a fourth embodiment of the invention in a high reflectance mode and a low reflectance mode respectively.

Referring to FIG. 9A and FIG. 9B, the main difference between the reflectance-adjustable display device 20 and the reflectance-adjustable display device 10 in FIG. 8A and FIG. 8B is as follow. The same components are labeled with the same reference numerals. Thus, description of the materials, relative configuration, and effects thereof are not repeated hereinafter. In the reflectance-adjustable display device 20, the display device 22 is an organic light emitting display device that comprises a circular polarizer CP adjacent to the reflectance-adjustable reflector 14. The circular polarizer CP may comprises a quarter-wave plate and a linear polarizer having an absorption axis ACP.

In the embodiment, the display device 22 may further include a top substrate SUBT, a bottom substrate SUBB, an anode electrode layer EA, a cathode electrode layer EC, a hole transporting layer HTL, an electron transporting layer ETL, and an organic light-emitting layer OL. The top substrate SUBT is located between the bottom substrate SUBB and the reflectance-adjustable reflector 14. The organic light-emitting layer OL is located between the bottom substrate SUBB and the top substrate SUBT. The anode electrode layer EA is located between the organic light-emitting layer OL and the top substrate SUBT. The cathode electrode layer EC is located between the organic light-emitting layer OL and the bottom substrate SUBB. The hole transporting layer HTL is located between the organic light-emitting layer OL and the anode electrode layer EA. The electron transporting layer ETL is located between the organic light-emitting layer OL and the cathode electrode layer EC. The circular polarizer CP is located on the top substrate SUBT, wherein the top substrate SUBT is located between the circular polarizer CP and the anode electrode layer EA. The display surface DS of the display device 22 is, for example, a top surface of the circular polarizer CP, but the invention is not limited thereto.

In the embodiment, the reflection axis A130 of the second polarizer 130 is parallel to the absorption axis ACP of the circular polarizer CP, so that the light B' emitted from the display device 22 may pass the second polarizer 130. In detail, a polarization direction of the light B' output from the circular polarizer CP shall be vertical to the absorption axis ACP, therefore, the light B' is a P polarized light. Since the P polarized light is vertical to the reflection axis A130 of the second polarizer 130, the light B' passes through the second polarizer 130 in both of the high reflectance mode and the low reflectance mode. However, the invention is not limited to the above. In another embodiment, the reflection axis A130 of the second polarizer 130 may be vertical to the absorption axis ACP of the circular polarizer CP, and the reflectance-adjustable display device 20 may further includes a half wave plate (not shown) located between the display device 22 and the reflectance-adjustable reflector 14, so that the light B' from the display device 22 may pass the second polarizer 130.

In the high reflectance mode, as shown in FIG. 9A, under the condition that the reflection axis A120 of the first polarizer 120 is vertical to the reflection axis A130 of the second polarizer 130, no phase difference is provided by the phase modulation layer PM in the high reflectance mode, thus the light B' (P polarized light) passes the phase modulation layer PM without change in polarization direction. Since the polarization direction of the light B' (P polarized light) is parallel to the reflection axis A120 of the first polarizer 120, the light B' is then reflected by the first polarizer 120 (the light reflected by the second polarizer 130 is not shown). Namely, the light B' from the display device 22 will not be perceived by the user in the high reflectance mode.

On the other hand, as shown in FIG. 9B, under the condition that the reflection axis A120 of the first polarizer 120 is vertical to the reflection axis A130 of the second polarizer 130, a half wavelength phase difference is provided by the phase modulation layer PM in the low reflectance mode, thus the light B' (P polarized light) passing the second polarizer 130 is turned into the S polarized light after passing the phase modulation layer PM. Since the polarization direction of the S polarized light is vertical to the reflection axis A120 of the first polarizer 120, the light B' passing the phase modulation layer PM passes the first polarizer 120. Namely, the light B' emitted from the display device 22 will be perceived by the user in the low reflectance mode.

In the low reflectance mode, it is noted that the light B2 passing the second polarizer 130 and transmitted to the display device 22 is turned into dextrorotation light after passing the circular polarizer CP. Under the condition that the cathode electrode layer EC is a reflective electrode layer, the dextrorotation light is turned into laevorotatory light after being reflected by the cathode electrode layer EC. The laevorotatory light is then absorbed by the circular polarizer CP.

Referring to FIG. 10A and FIG. 10B, the main difference between the reflectance-adjustable display device 30 and the reflectance-adjustable display device 10 in FIG. 8A and FIG. 8B is as follow. In the reflectance-adjustable display device 30, the display device 32 is an electrophoretic display device.

In the embodiment, the display device 32 may include a top substrate SUBT, a bottom substrate SUBB, a top electrode layer ET, a bottom electrode layer EB, and an electrophoretic layer EP. The top substrate SUBT is located between the bottom substrate SUBB and the reflectance-adjustable reflector 14. The electrophoretic layer EP is located between the bottom substrate SUBB and the top substrate SUBT. The top electrode layer ET is located between the electrophoretic layer EP and the top substrate SUBT. The bottom electrode layer EB is located between the electrophoretic layer EP and the bottom substrate SUBB. The display surface DS of the display device 32 is, for example, a top surface of the top substrate SUBT, but the invention is not limited thereto.

The electrophoretic display device (the display device 32) is a reflective display device. Namely, the ambient light serve as the illumination light of the electrophoretic display device. Since the light B2 passing the phase modulation layer PM is reflected by the second polarizer 130 instead of transmitted to the display device 32 in the high reflectance mode, as shown in FIG. 10A, the user will not perceived the light B' from the display device 32 in the high reflectance mode.

On the other hand, as shown in FIG. 10B, under the condition that the reflection axis A120 of the first polarizer 120 is vertical to the reflection axis A130 of the second polarizer 130, a half wavelength phase difference is provided by the phase modulation layer PM in the low reflectance mode, thus the S polarized light passing the first polarizer 120 is turned into the P polarized light after passing the phase modulation layer PM. Since the polarization direction of the P polarized light is vertical to the reflection axis A130 of the second polarizer 130, the P polarized light then passes the second polarizer 130 and is transmitted to the display device 32 and serve as the illumination light of the display device 32. The P polarized light transmitted to the display device 32 is then depolarized by the electrophoretic layer EP. Thus, the light B' (the depolarized light B2 with display information) from the display device 32 includes S polarized light and P polarized light. Since the polarization direction of the S polarized light is parallel to the reflection axis A130 of the second polarizer 130, and the polarization direction of the P polarized light is vertical to the reflection axis A130 of the second polarizer 130, the S polarized light is reflected by the second polarizer 130 (the light reflected by the second polarizer 130 is not shown) while the P polarized light passes the second polarizer 130. The light B' (the P polarized light) passing the second polarizer 130 is turned into the S polarized light after passing the phase modulation layer PM. Since the polarization direction of the S polarized light is vertical to the reflection axis A120 of the first polarizer 120, the light B' passing the phase modulation layer PM passes the first polarizer 120. Namely, the light B' from the display device 32 will be perceived by the user in the low reflectance mode.

Referring to FIG. 11A and FIG. 11B, the main difference between the reflectance-adjustable display device 40 and the reflectance-adjustable display device 20 in FIG. 9A and FIG. 9B is as follow. In the reflectance-adjustable display device 40, the display device 42 adopts the configuration of the display device 22 in FIG. 9A and FIB. 9B but omits the circular polarizer CP in FIG. 9A and FIG. 9B. The reflectance-adjustable reflector 44 adopts the configuration of the reflectance-adjustable reflector 110 in FIG. 6A and FIB. 6B but omits the reflective layer 180 in FIG. 6A and FIG. 6B. However, the invention is not limited to the above. In another embodiment, the absorption-type polarizing film 170 may be omitted, and the first polarizer 120 may be a reflection-type polarizing film or an absorption-type polarizing film.

In the high reflectance mode, as shown in FIG. 11A, since the polarization direction of the P polarized light (marked as a double arrow) is parallel to the reflection axis A120 of the first polarizer 120, and the polarization direction of the S polarized light (marked as a circle with an X in the middle) is vertical to the reflection axis A120 of the first polarizer 120 and the absorption axis A170 of the absorption-type polarizing film 170, the P polarized light is reflected by the first polarizer 120 (the light reflected by the first polarizer 120 is marked as B1) while the S polarized light sequentially passes the first polarizer 120 and the absorption-type polarizing film 170 (the light passes the first polarizer 120 and the absorption-type polarizing film 170 is marked as B2). No wavelength phase difference is provided by the phase modulation layer PM in the high reflectance mode, thus the S polarized light passing the absorption-type polarizing film 170 passes the phase modulation layer PM without change in polarization direction and is further transmitted to the display device 42. Under the condition that the cathode electrode layer EC is a reflective electrode layer, the S polarized light is reflected by the cathode electrode layer EC and sequentially passes the phase modulation element 110, the absorption-type polarizing film 170, and the first polarizer 120. The light B' from the display device 42 includes the P polarized light and the S polarized light. Since the polarization direction of the P polarized light (marked as a double arrow) is parallel to the absorption axis A170 of the absorption-type polarizing film 170, and the polarization direction of the S polarized light (marked as a circle with an X in the middle) is vertical to the absorption axis A170 of the absorption-type polarizing film 170 and the reflection axis A120 of the first polarizer 120, the P polarized light is absorbed by the absorption-type polarizing film 170 while the S polarized light sequentially passes the absorption-type polarizing film 170 and the first polarizer 120. Namely, not only the light B1 reflected by the first polarizer 120 and the light B2 reflected by the cathode electrode layer EC and output from the reflectance-adjustable reflector 44, but also the light B' from the display device 42 can be perceived by the user in the high reflectance mode.

In the low reflectance mode, as shown in FIG. 11B, a quarter wavelength phase difference is provided by the phase modulation layer PM, thus the S polarized light passing the absorption-type polarizing film 170 is turned into dextrorotation light after passing the phase modulation layer PM. After reflected by the cathode electrode layer EC, the dextrorotation light is turned into laevorotatory light, and the laevorotatory light is turned into the P polarized light after passing the phase modulation layer PM. Since the polarization direction of the P polarized light is parallel to the absorption axis A170 of the absorption-type polarizing film 170, the P polarized light is then absorbed by the absorption-type polarizing film 170. The light B' from the display device 42 includes the P polarized light and the S polarized light. Since the polarization direction of the P polarized light (marked as a double arrow) is parallel to the absorption axis A170 of the absorption-type polarizing film 170, and the polarization direction of the S polarized light (marked as a circle with an X in the middle) is vertical to the absorption axis A170 of the absorption-type polarizing film 170 and the reflection axis A120 of the first polarizer 120, the P polarized light is absorbed by the absorption-type polarizing film 170 while the S polarized light sequentially passes the absorption-type polarizing film 170 and the first polarizer 120. Namely, not only the light B1 reflected by the first polarizer 120, but also the light B' from the display device 22 can be perceived by the user in the low reflectance mode.

In conclusion of the above, the embodiments of the invention achieve at least one of the following advantages or effects. In the reflectance-adjustable reflector according to the embodiments of the invention, the phase retardation provided by the phase modulation layer may be modulated by modulating the electric potential difference between the first electrode layer and the second electrode layer. With the collaboration of the first polarizer, the amount of light reflected by the reflectance-adjustable reflector may be adjusted. Therefore, the reflectance-adjustable reflector of the invention and the reflectance-adjustable display device using the same may render ideal reflectance to adapt to the environment. Moreover, since the thicknesses of the first substrate and the second substrate are between 0.01 mm and 0.5 mm, and the total thickness of the phase modulation element and the first polarizer is less than 1 mm, ghost image phenomenon can be avoided, and thereby improving the quality of a displayed image of the reflectance-adjustable reflector and the reflectance-adjustable display device.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A reflectance-adjustable reflector, comprising:
   a phase modulation element, comprising:
      a first substrate;
      a second substrate, opposite to the first substrate, wherein thicknesses of the first substrate and the second substrate are between 0.01 mm and 0.5 mm;
      a phase modulation layer, located between the first substrate and the second substrate;
      a first electrode layer, located between the first substrate and the phase modulation layer; and
      a second electrode layer, located between the second substrate and the phase modulation layer;
   a first polarizer, disposed on the first substrate, wherein the first substrate is located between the first polarizer and the first electrode layer, a total thickness of the phase modulation element and the first polarizer is less than 1 mm, and the first polarizer is a reflection-type polarizing film; and
   an absorption-type polarizing film, located between the first polarizer and the first substrate, wherein a total thickness of the phase modulation element, the first polarizer, and the absorption-type polarizing film is less than 1 mm.

2. The reflectance-adjustable reflector according to claim 1, wherein the phase modulation layer is a liquid crystal layer, and the reflectance-adjustable reflector further comprises:
   a first phase compensation layer, located between the first polarizer and the first substrate; and
   a second phase compensation layer, disposed under the second substrate, wherein the second substrate is located between the second phase compensation layer and the second electrode layer, and a total thickness of the phase modulation element, the first polarizer, the first phase compensation layer, and the second phase compensation layer is less than 1 mm.

3. The reflectance-adjustable reflector according to claim 1, further comprising:
   a light absorbing layer, disposed on the first polarizer, wherein the first polarizer is located between the light absorbing layer and the first substrate.

4. The reflectance-adjustable reflector according to claim 1, further comprising:
   a light absorption-adjustable layer, disposed on the first polarizer, wherein the first polarizer is located between the light absorption-adjustable layer and the first substrate.

5. The reflectance-adjustable reflector according to claim 1, further comprising:
   a reflective layer, disposed under the second substrate, wherein the second substrate is located between the reflective layer and the second electrode layer.

6. The reflectance-adjustable reflector according to claim 1, wherein the second electrode layer is a reflective electrode layer.

7. A reflectance-adjustable display device, comprising:
   a display device, having a display surface; and
   a reflectance-adjustable reflector, located on the display surface and comprising:
      a phase modulation element, comprising:
         a first substrate;
         a second substrate, located between the display device and the first substrate, wherein thicknesses of the first substrate and the second substrate are between 0.01 mm and 0.5 mm;
         a phase modulation layer, located between the first substrate and the second substrate;
         a first electrode layer, located between the first substrate and the phase modulation layer; and
         a second electrode layer, located between the second substrate and the phase modulation layer;
      a first polarizer, disposed on the first substrate, wherein the first substrate is located between the first polarizer and the first electrode layer, and a total thickness of the phase modulation element and the first polarizer is less than 1 mm, wherein the first polarizer is a reflection-type polarizing film; and
      an absorption-type polarizing film, located between the first polarizer and the first substrate, wherein a total thickness of the phase modulation element, the first polarizer, and the absorption-type polarizing film is less than 1 mm.

8. The reflectance-adjustable display device according to claim 7, wherein the display device is a liquid crystal display device and comprises a backlight module and a display panel located between the reflectance-adjustable reflector and the backlight module.

9. The reflectance-adjustable display device according to claim 7, wherein the display device is an organic light emitting display device that comprises a circular polarizer adjacent to the reflectance-adjustable reflector.

10. The reflectance-adjustable display device according to claim 7, wherein the display device is an electrophoretic display device.

11. The reflectance-adjustable display device according to claim 7, wherein the display device is an organic light emitting display device.

12. The reflectance-adjustable display device according to claim 7, wherein the phase modulation layer is a liquid crystal layer, and the reflectance-adjustable reflector further comprises:
   a first phase compensation layer, located between the first polarizer and the first substrate; and
   a second phase compensation layer, disposed under the second substrate, wherein the second substrate is located between the second phase compensation layer and the second electrode layer, and a total thickness of the phase modulation element, the first polarizer, the first phase compensation layer, and the second phase compensation layer is less than 1 mm.

13. The reflectance-adjustable display device according to claim 7, wherein the reflectance-adjustable reflector further comprises:
   a light absorbing layer, disposed on the first polarizer, wherein the first polarizer is located between the light absorbing layer and the first substrate.

14. The reflectance-adjustable display device according to claim 7, wherein the reflectance-adjustable reflector further comprises:
   a light absorption-adjustable layer, disposed on the first polarizer, wherein the first polarizer is located between the light absorption-adjustable layer and the first substrate.

* * * * *